(12) United States Patent
Nemati

(10) Patent No.: US 8,576,649 B1
(45) Date of Patent: Nov. 5, 2013

(54) SENSE AMPLIFIERS AND OPERATIONS THEREOF

(76) Inventor: Farid Nemati, Redwood City, CA (US)

(*) Notice: Subject to any disclaimer, the term of this patent is extended or adjusted under 35 U.S.C. 154(b) by 75 days.

(21) Appl. No.: 13/172,017

(22) Filed: Jun. 29, 2011

Related U.S. Application Data

(60) Provisional application No. 61/361,357, filed on Jul. 2, 2010.

(51) Int. Cl.
*G11C 7/00* (2006.01)

(52) U.S. Cl.
USPC ............. 365/205; 365/189.05; 365/189.09; 365/203

(58) Field of Classification Search
USPC ............. 365/205, 189.05, 189.09, 203
See application file for complete search history.

(56) References Cited

U.S. PATENT DOCUMENTS

| | | | |
|---|---|---|---|
| 5,926,428 A * | 7/1999 | Rao | 365/207 |
| 6,611,452 B1 | 8/2003 | Han | |
| 6,721,220 B2 | 4/2004 | Yoon | |
| 6,734,815 B1 | 5/2004 | Abdollahi-Alibeik | |
| 6,735,113 B2 | 5/2004 | Yoon | |
| 6,756,838 B1 | 6/2004 | Wu | |
| 6,778,435 B1 | 8/2004 | Han | |
| 6,781,888 B1 | 8/2004 | Horch | |
| 6,785,169 B1 | 8/2004 | Nemati | |
| 6,804,162 B1 | 10/2004 | Eldridge | |
| 6,819,612 B1 * | 11/2004 | Achter | 365/205 |
| 6,885,581 B2 | 4/2005 | Nemati | |
| 6,891,774 B1 | 5/2005 | Abdollahi-Alibeik | |
| 6,903,987 B2 | 6/2005 | Yoon | |
| 6,937,085 B1 | 8/2005 | Samaddar | |
| 6,940,772 B1 | 9/2005 | Horch | |
| 6,944,051 B1 | 9/2005 | Lee | |
| 6,944,078 B2 * | 9/2005 | Takemura et al. | 365/205 |
| 6,947,349 B1 | 9/2005 | Abdollahi-Alibeik | |
| 6,958,931 B1 | 10/2005 | Yoon | |
| 7,042,759 B2 | 5/2006 | Nemati | |
| 7,054,191 B1 | 5/2006 | Gupta | |
| 7,078,739 B1 | 7/2006 | Nemati | |
| 7,089,439 B1 | 8/2006 | Abdollahi-Alibeik | |
| 7,096,144 B1 | 8/2006 | Bateman | |
| 7,187,530 B2 | 3/2007 | Salling | |
| 7,268,373 B1 | 9/2007 | Gupta | |
| 7,304,327 B1 | 12/2007 | Nemati | |
| 7,319,622 B1 | 1/2008 | Roy | |
| 7,369,450 B2 * | 5/2008 | Choy | 365/205 |
| 7,379,381 B1 | 5/2008 | Roy | |

(Continued)

OTHER PUBLICATIONS

U.S. Appl. No. 12/501,995, filed Jul. 13, 2009, Chopra.

(Continued)

*Primary Examiner* — Pho M Luu
(74) *Attorney, Agent, or Firm* — The Webostad Firm

(57) ABSTRACT

Sense amplifiers and operations thereof are described. More particularly, embodiments of integrated circuit having a sense amplifier coupled to a first bitline and a second bitline of a memory array are described. The sense amplifier generally includes: a latch circuit and a group select input/output circuit, as well as read, reference voltage, and precharge circuitry. Further described is an embodiment of a method for a refresh operation. First data states of a group of memory cells of an array are read and written back as second data states without changing voltages at sense nodes of the latch circuits from the reading, where the second data states are an inverse of the first data states.

29 Claims, 23 Drawing Sheets

(56) References Cited

U.S. PATENT DOCUMENTS

| | | | |
|---|---|---|---|
| 7,405,963 | B2 | 7/2008 | Nemati |
| 7,460,395 | B1 | 12/2008 | Cho |
| 7,464,282 | B1 | 12/2008 | Abdollahi-Alibeik |
| 7,573,077 | B1 | 8/2009 | Ershov |
| 7,587,643 | B1 | 9/2009 | Chopra |
| 7,738,274 | B1 | 6/2010 | Nemati |
| 8,169,812 | B2 * | 5/2012 | Lynch .......................... 365/149 |
| 8,320,209 | B2 * | 11/2012 | Yadav et al. ............... 365/210.1 |

OTHER PUBLICATIONS

Micron, DDR3 SDRAM, 2006, Micron Technology, Boise, Id.

Bez, Chalcogenide PCM: A Memory Technology for Next Decade, Numonyx, R&D Technology Development, Via C. Olivetti 2, 20041, Agrate Brianza, IEEE, Jun. 2009, 5.1.1-5.1.4, Milan, Italy.

Servalli, A 45nm Generation Phase Change Memory Technology, Numonyx, R&D Technology Development, Via C. Olivetti 2, 20041 Agrate Brianza, IEEE, Jun. 2009, 5.7.1-5.7.4, Milan, Italy.

* cited by examiner

SENSE AMPLIFIERS AND OPERATIONS THEREOF

FIELD

One or more aspects of the invention generally relate to integrated circuit devices and operations thereof. More particularly, one or more aspects of the invention relate to sense amplifiers and operations thereof.

BACKGROUND

Semiconductor memories such as static random access memory ("SRAM") and dynamic random access memory ("DRAM") are in widespread use. DRAM is very common due to its high density with a cell size typically between $6F^2$ and $8F^2$, where F is a minimum feature size. However, DRAM is relatively slow, having an access time commonly near 20 nanoseconds ("ns"). Although SRAM access time is typically an order of magnitude faster than DRAM, an SRAM cell is commonly made of four transistors and two resistors or of six transistors, thus leading to a cell size of approximately $60F^2$ to $100F^2$.

Others have introduced memory designs based on a negative differential resistance ("NDR") cell, such as a thyristor-base memory cell, to minimize the size of a conventional SRAM memory. A thyristor-based random access memory ("RAM") may be effective in memory applications. Additional details regarding a thyristor-based memory cell are described in U.S. Pat. Nos. 6,891,205 B1 and 7,460,395 B1.

Charge leakage out of a thyristor-based memory cell negatively impacts the restore rate of such cell. Additional details regarding periodically pulsing a thyristor-based memory cell to restore or refresh state of such a cell may be found in Patent Cooperation Treaty ("PCT") International Publication WO 02/082504.

Operation of an array of thyristor-based memory cells consumes power. Accordingly, it would be desirable and useful to provide an array of thyristor-based memory cells that consumes less power.

BRIEF SUMMARY

One or more aspects generally relate to sense amplifiers and operations thereof.

An embodiment is an integrated circuit having a sense amplifier coupled to a first bitline and a second bitline of a memory array. The sense amplifier includes: a latch circuit having a first sense amplifier node and a second sense amplifier node respectively coupled to the first bitline and the second bitline; a group select input/output circuit coupled to the first sense amplifier node and the second sense amplifier node; and a read-precharge-reference voltage circuit coupled to the first sense amplifier node and the second sense amplifier node.

Another embodiment is an integrated circuit having a sense amplifier coupled to a first bitline and a second bitline of a memory array, where the sense amplifier includes: a latch circuit having a first sense amplifier node and a second sense amplifier node respectively coupled to the first bitline and the second bitline; a group select input/output circuit coupled to the first sense amplifier node and the second sense amplifier node; and a reference voltage circuit, a read circuit, and a precharge circuit coupled in parallel with one another to the first sense amplifier node and the second sense amplifier node.

Yet another embodiment is an integrated circuit having a sense amplifier coupled to a first bitline and a second bitline of a memory array, where the sense amplifier includes: a latch circuit having a first sense amplifier node and a second sense amplifier node respectively coupled to the first bitline and the second bitline; a group select input/output circuit coupled to the first sense amplifier node and the second sense amplifier node; and a reference voltage circuit and a read circuit coupled in parallel with one another to the first sense amplifier node and the second sense amplifier node.

Still yet another embodiment is an integrated circuit having a sense amplifier coupled to a first bitline and a second bitline of a memory array, where the sense amplifier includes: a latch circuit having a first sense amplifier node and a second sense amplifier node respectively coupled to the first bitline and the second bitline; a group select input/output circuit coupled to the first sense amplifier node and the second sense amplifier node; a first transistor having a first source/drain node coupled to the first sense amplifier node and having a second source/drain node coupled to an intermediate node, the first transistor gated with a first sample signal; a second transistor having a first source/drain node coupled to the second sense amplifier node and having a second source/drain node coupled to a reference voltage, the second transistor gated with a second sample signal; a third transistor having a first source/drain node coupled to the intermediate node and having a second source drain node coupled to a supply voltage, the third transistor gated with a read signal; a first bit voltage select circuit coupled between the intermediate node and the first bitline; and a second bit voltage select circuit coupled between the intermediate node and the second bitline.

Still yet further another embodiment is an integrated circuit having a sense amplifier coupled to a first bitline and a second bitline of a memory array, where the sense amplifier includes: a latch circuit having a first sense amplifier node and a second sense amplifier node respectively coupled to the first bitline and the second bitline; a group select input/output circuit coupled to the first sense amplifier node and the second sense amplifier node; a first transistor having a first source/drain node coupled to the first sense amplifier node and having a second source/drain node coupled to a bitline, the first transistor gated with a first sample signal; a second transistor having a first source/drain node coupled to the second sense amplifier node and having a second source/drain node coupled to a reference voltage, the second transistor gated with a second sample signal; a third transistor having a first source/drain node coupled to the bitline and having a second source drain node coupled to a supply voltage, the third transistor gated with a read signal; and a fourth transistor having a first source/drain node coupled to the bitline and having a second source/drain node coupled to a bit voltage, the fourth transistor gated with a precharge signal.

Another embodiment is a method for a refresh operation, including: activating latch circuits; reading first data states of a grouping of memory cells of an array; and writing back second data states to the grouping of memory cells without changing voltages at sense nodes of the latch circuits from the reading, where the second data states are an inverse of the first data states.

BRIEF DESCRIPTION OF THE DRAWING(S)

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 1A though 1D are a circuit diagrams depicting an exemplary embodiments of an integrated circuits with memory arrays.

FIGS. 3, 5, 7, 9, 11, 13, and 15 are circuit diagrams depicting exemplary embodiments of sense amplifiers.

FIGS. 4, 6A and 6B, 8, 10, 12, 14, and 16 are signal diagrams depicting exemplary embodiments of DDR3 operations 400 for sense amplifiers of FIGS. 3, 5, 7, 9, 11, 13, and 15, respectively.

Figure 17:
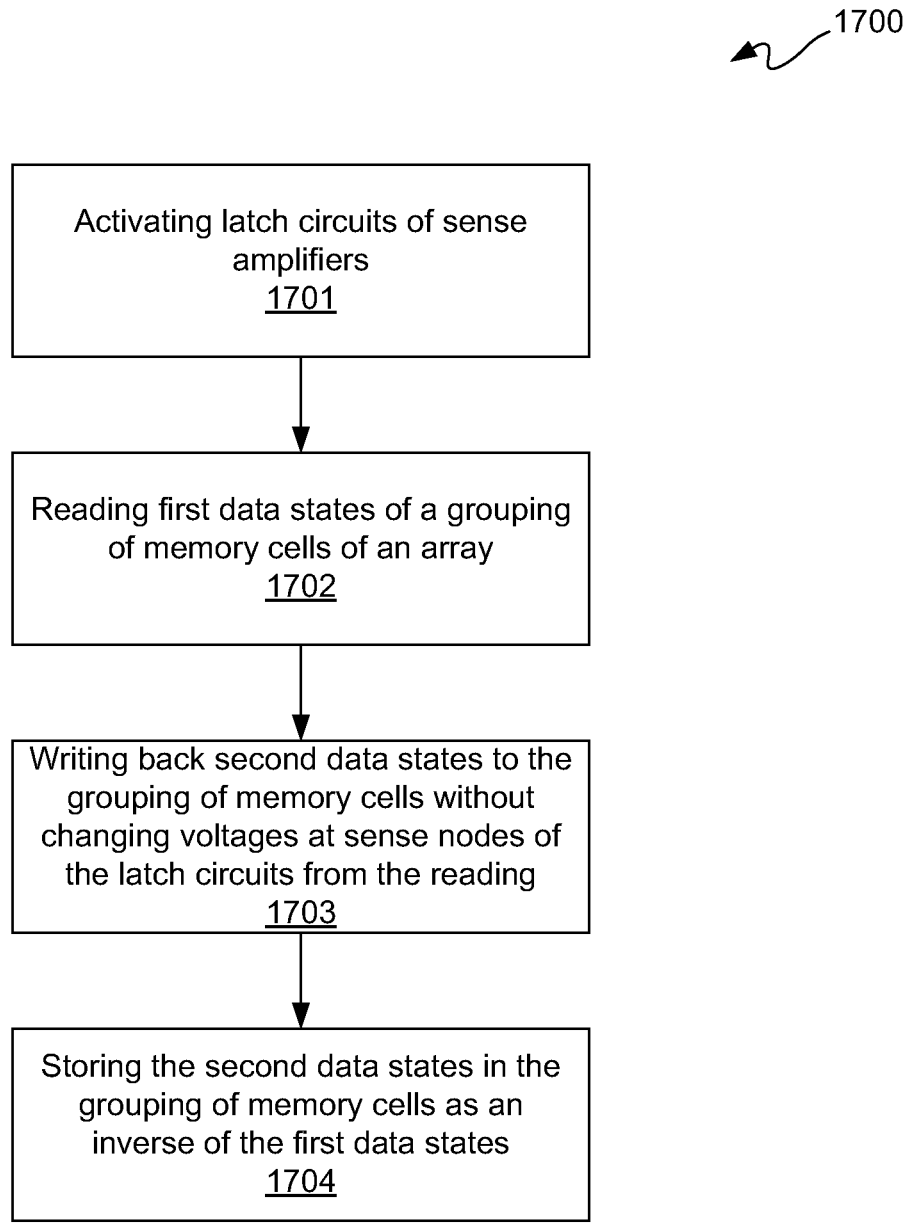

FIG. 17 is a flow diagram depicting an exemplary embodiment of operations for a sense amplifier for a refresh of a grouping of memory cells of an array.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items; however, in alternative embodiments the items may be different. Moreover, for purposes of clarity, a single signal or multiple signals may be referred to or illustratively shown as a signal to avoid encumbering the description with multiple signal lines. Moreover, along those same lines, a transistor, among other circuit elements, may be referred to or illustratively shown as a single transistor though such reference or illustration may be representing multiples thereof. Furthermore, though particular signals and voltages may be described herein for purposes of clarity by way of example, it should be understood that the scope of the description is not limited to these particular numerical examples as other values may be used.

Before a detailed description of exemplary embodiments, discussion of some terminology surrounding thyristor-based memory cells may be helpful. Voltage on a supply voltage line may be above both a logic low voltage reference level ("Vss" or "VSS") and a logic high voltage reference level ("Vdd" or "VDD"), and this supply voltage may be used as an anodic voltage for a thyristor-based memory cell. Accordingly, reference to this supply voltage includes its anodic use, and as such it is referred to herein as "VDDA" to clearly distinguish it from Vdd. Thyristor-based memory cells have an anode or anode emitter region, a cathode or cathode emitter region, a p-base or p-base region, and an n-base or n-base region.

Thyristor-based memory cells have an anode or anode emitter region, a cathode or cathode emitter region, a p-base or p-base region, and an n-base or n-base region. Each thyristor-based memory cell may optionally include an access device, which may be a field effect transistor ("FET"), for SRAM applications. However, the exemplary embodiments described below are for DRAM application, namely thyristor-based memory cells that do not have corresponding access devices as part of the cell. This is for purposes of clarity and not limitation, as it shall be understood that either or both DRAM and SRAM applications may be used.

Thyristor-based memory cells may have an equivalent circuit model, namely a storage element, cross coupled bi-polar junction transistors ("BJTs") and a capacitor. Such storage element may be a type of a device known as Thin Capacity Coupled Thyristor ("TCCT") device. Thus, sometimes thyristor-based memory cells are alternatively referred to as TCCT cells. If the main or "first" base is n-type, then such thyristor-based memory cells may be referred to as n-TCCT cells; or, if the main or "first" base is p-type, then such thyristor-based memory cells may be referred to as p-TCCT cells. The main or first base is principally capacitively coupled to a gate of the TCCT cell. A secondary or "second" base may be located adjacent to the first base. However, the "second" base likely will have a much smaller capacitive coupling to the gate. A gate dielectric, which may be one or more layers, separates the first base, and in some embodiments the second base, from the gate.

For each thyristor-based memory cell array, there is a first wordline ("WL1") associated with either emitter node of the cells of such array. A control gate of a storage element, which may generally be associated with a plate of a capacitor, may be formed with a second wordline ("WL2"). For convenience, WL2s are associated with columns, and WL1s are associated with columns or rows, as described below in additional detail. However, an opposite orientation of WL2s may be used provided such WL2s are generally perpendicular to bitlines.

The exact number of memory cells or bits associated with a WL1 or a WL2 may vary from application to application, and may vary between SRAM and DRAM applications. Some other details regarding thyristor-based memory cells, including silicides, extension regions, and spacers, among other details, may be found in U.S. Pat. Nos. 6,767,770 B1 and 6,690,039 B1.

Figure 1A:
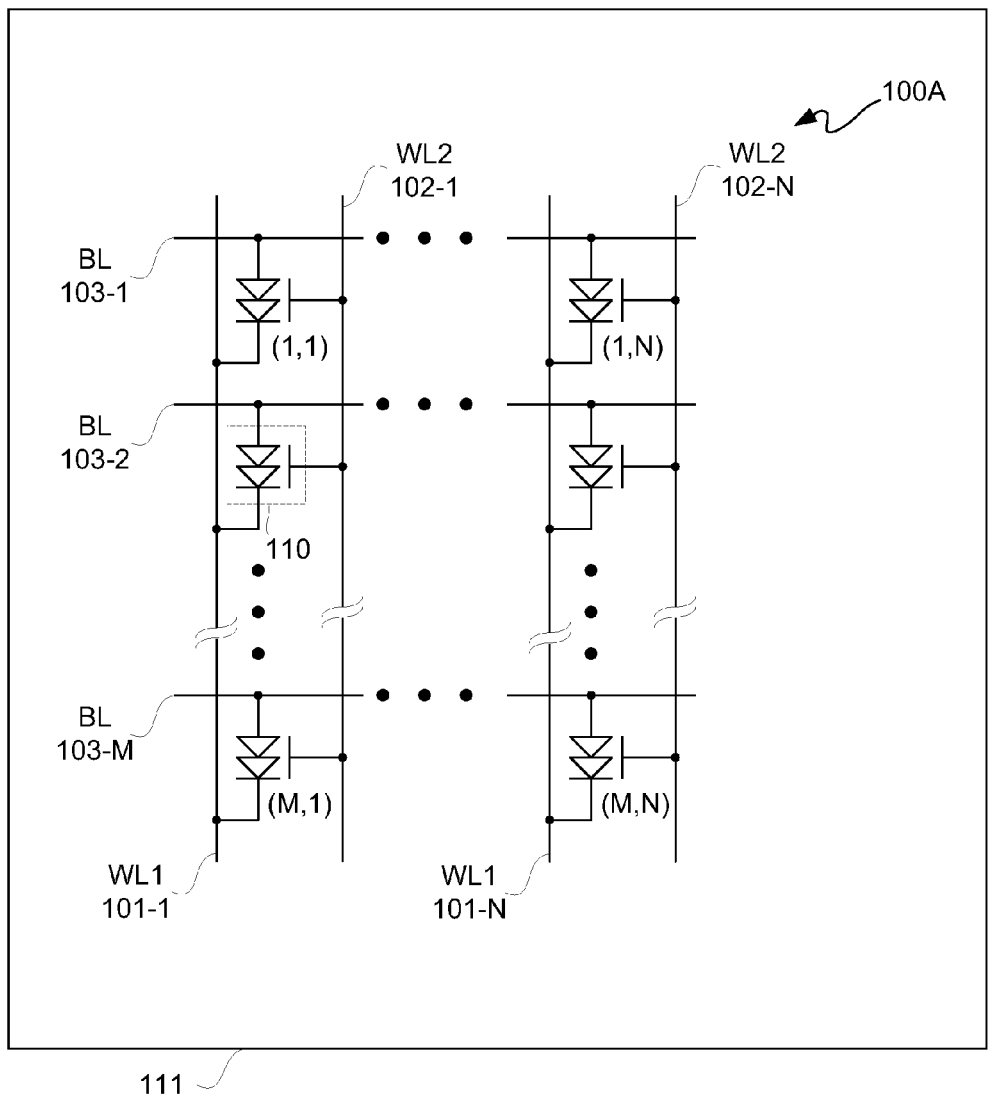

FIG. 1A is a circuit diagram depicting an exemplary embodiment of an integrated circuit 111. Integrated circuit 111 includes a memory array 100A. Memory array 100A is coupled to memory array peripheral circuitry, which is not shown for purposes of clarity. Such peripheral circuitry may include decoders, drivers, and sense amplifiers. Integrated circuit 111 may be a host chip for memory array 100A, where the primary purpose of integrated circuit 111 is not as a memory device, namely an embedded memory array 100A. In another embodiment, integrated circuit 111 may be a memory chip in which memory array 100A is located.

Memory array 100A includes memory cells 110. Memory cells 110 are thyristor-based memory cells or TCCT cells. Memory cells 110 may be lateral cells or vertical cells, as described below in additional detail. In this exemplary embodiment, memory cells 110 are DRAM cells made of p-TCCTs. In other embodiments, an access device may be used with thyristor-based memory cells 110, which access device is not shown here for purposes of clarity.

In this exemplary embodiment of memory array 100A, there are M rows and N columns, where M and N are integers each of which is greater than one. Memory array 100A has first wordlines ("WL1") 101-1 through 101-N, second wordlines ("WL2") 102-1 through 102-N, and bitlines ("BL") 103-1 through 103-M. Accordingly, each cell may be designated by its row and column coordinates, namely (M, N) values.

Wordlines 102-1 through 102-N are coupled to or formed as part of gates of thyristor-based memory cells 110. More particularly, a wordline, such as wordline 102-1 for example, is coupled to gates of thyristor-based memory cells 110 of a first column of such cells of memory array 100A. Moreover, in this exemplary embodiment, wordlines 101-1 through 101-N and 102-1 through 102-N, are associated with columns, and bitlines, such as bitlines 103-1 through 103-M are associated with rows.

Bitlines 103-1 through 103-M may be coupled to either anode or cathode emitters of memory cells 110. In this exemplary embodiment, bitlines 103-1 through 103-M are coupled to anodes. More particularly, a row of memory cells 110, namely memory cells (1, 1) to (1, N) may all be coupled to bitline 103-1 at respective anodes of such memory cells. Wordlines 101-1 through 101-N may be coupled to columns of memory cells 110, respectively, at cathodes of such memory cells. More particularly, memory cells (1, 1) to (M, 1) may each have their associated cathode nodes coupled to wordline 101-1 for example.

Figure 1B:
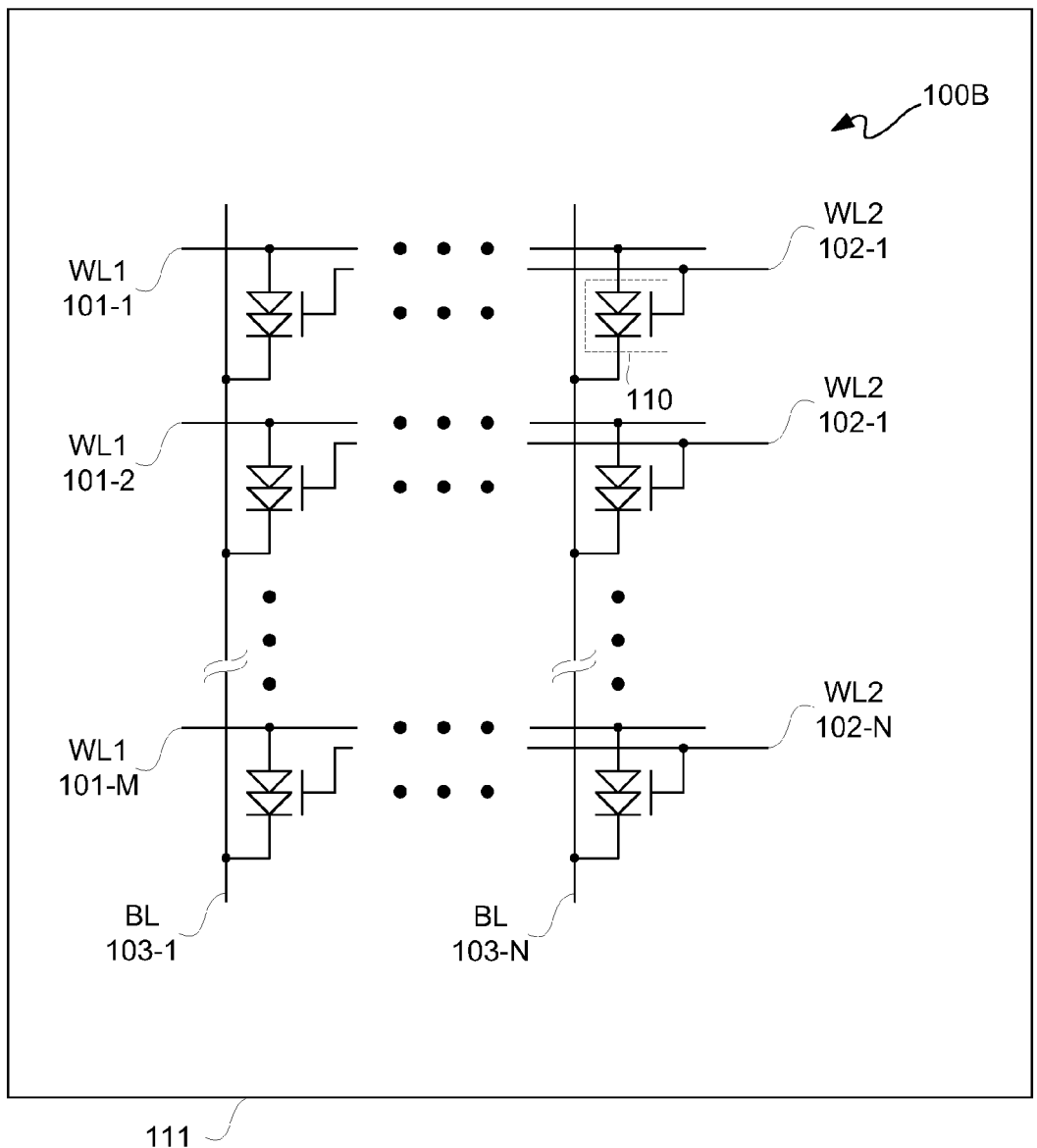

FIG. 1B is a circuit diagram depicting another exemplary embodiment of integrated circuit 111. In this depicted embodiment, integrated circuit 111 includes memory array 100B. Memory array 100B is the same as memory array 100A of FIG. 1A, except that wordlines and bitlines have been swapped and memory cells are n-TCCTs. In other words, first wordlines 101-1 through 101-M are associated with rows of thyristor-based memory cells 110, and bitlines 103-1 through 103-N are associated with columns of thyristor-based memory cells 110. Thus it should be appreciated that first wordlines may be coupled to anodes or cathodes of thyristor-based memory cells, and bitlines may be coupled to anodes or cathodes of thyristor-based memory cells.

Figure 1C:
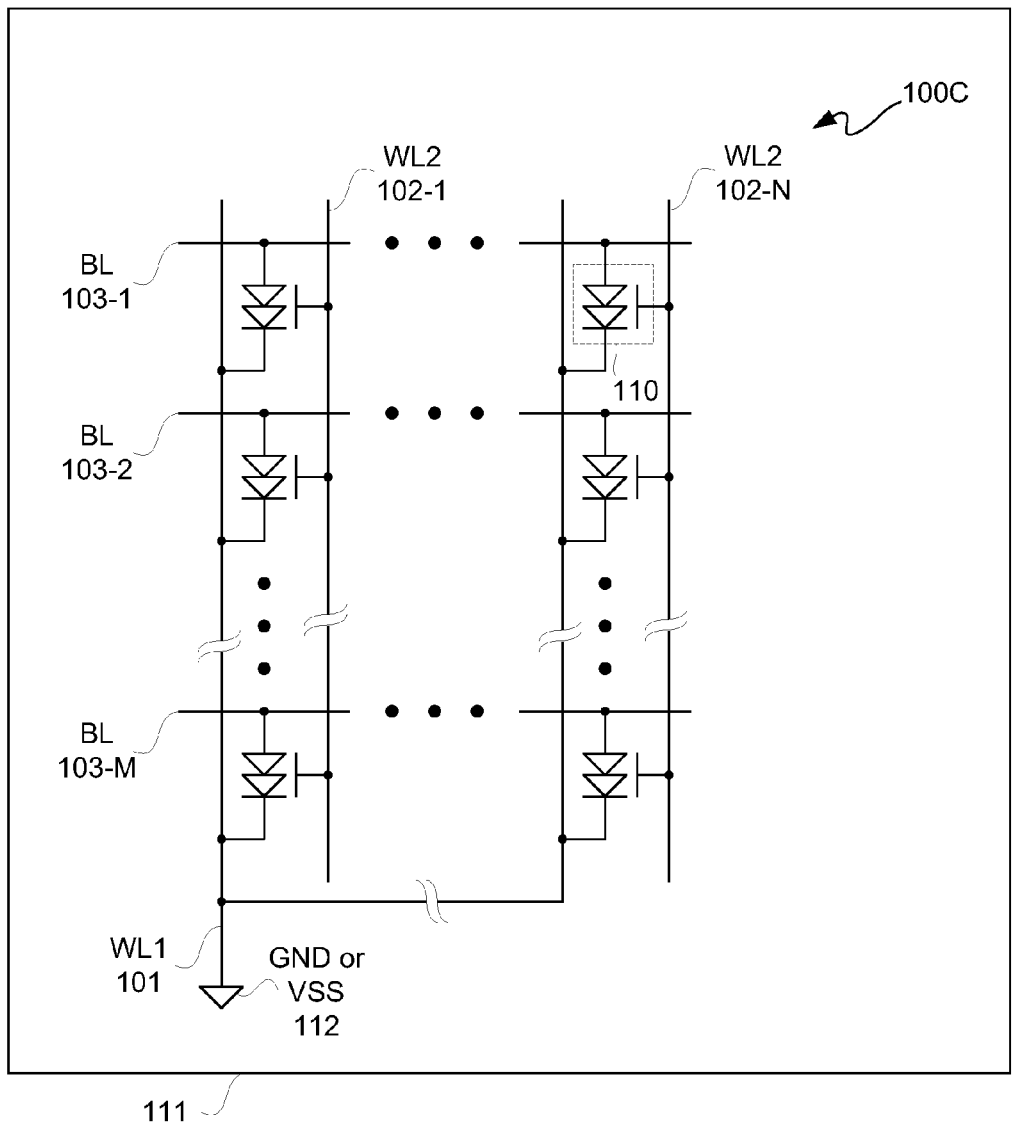

FIG. 1C is a circuit diagram depicting another exemplary embodiment of integrated circuit 111. In the depicted example embodiment, integrated circuit 111 includes memory array 100C. Memory array 100C is the same as memory array 100A of FIG. 1A, except that a single first wordline 101 is illustratively depicted as being coupled to two or more columns of thyristor-based memory cells 110. This configuration is referred to as a "common-plate" WL1 structure or a "common cathode" structure. Such first wordline 101 may be coupled to ground or Vss 112. Thus it should be appreciated that in such an embodiment, voltage on such first wordline 101 may be generally constant at a logic low voltage level, and bitlines 103 and WL2s 102 may be pulsed for operation of array 100C. In the depicted embodiment, all N columns of thyristor-based memory cells 110 are coupled to a same first wordline 101; however, not all N columns need to be connected to the same ground or Vss location. It should be understood that a Vss voltage level may be but is not necessarily a ground voltage level. For example, a VSS voltage level for a WL2 may be less than 0 V.

Figure 1D:
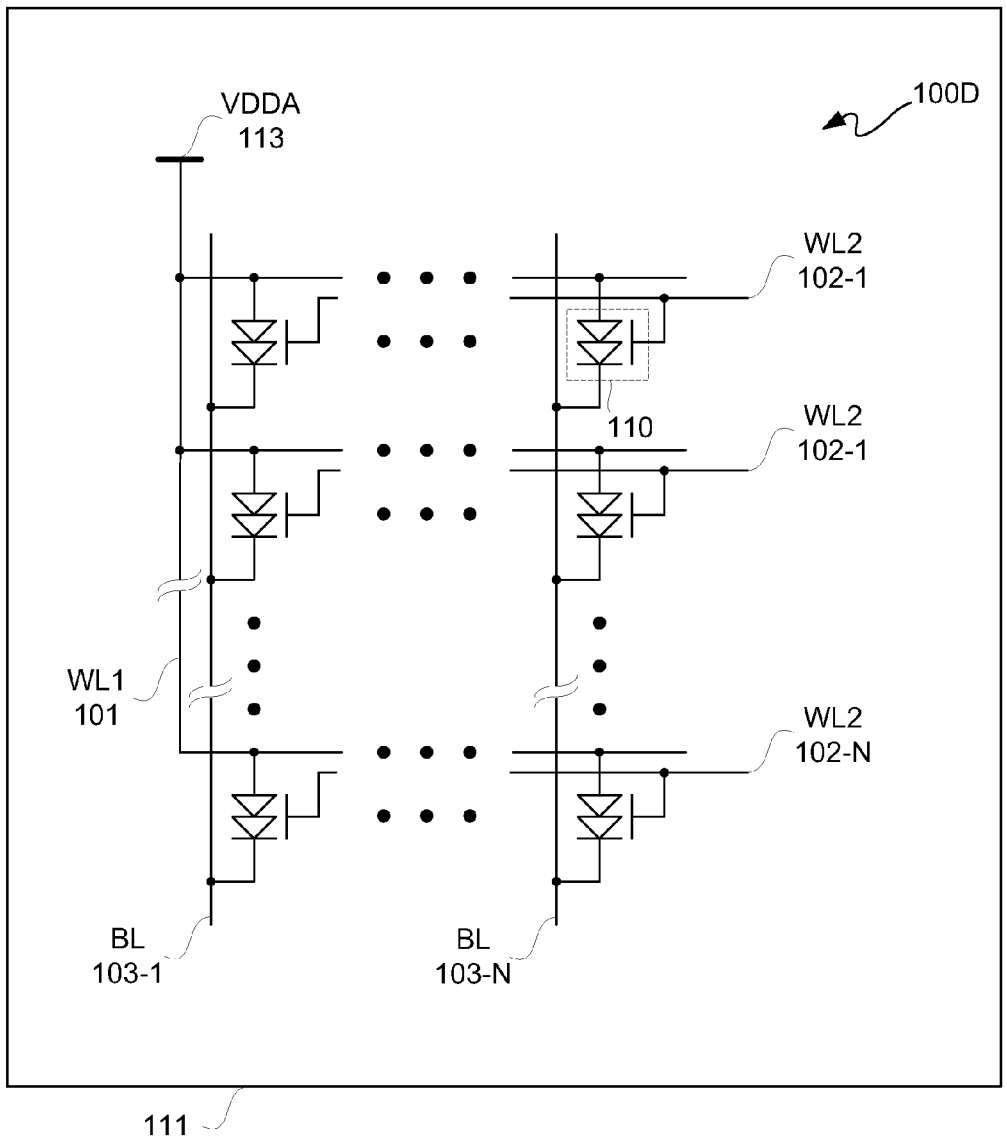

FIG. 1D is a circuit diagram depicting yet another exemplary embodiment of integrated circuit 111. In this depicted embodiment, integrated circuit 111 includes memory array 100D. Memory array 100D is the same as memory array 100B of FIG. 1B, except that two or more first wordlines are coupled together to provide a common or single first wordline 101. In this exemplary embodiment, WL1 101 is coupled to a supply voltage bus, namely VDDA bus 113.

Accordingly, it should be understood that in FIGS. 1C and 1D, respective embodiments of a "common plate" WL1 architecture are described.

Figure 2A:
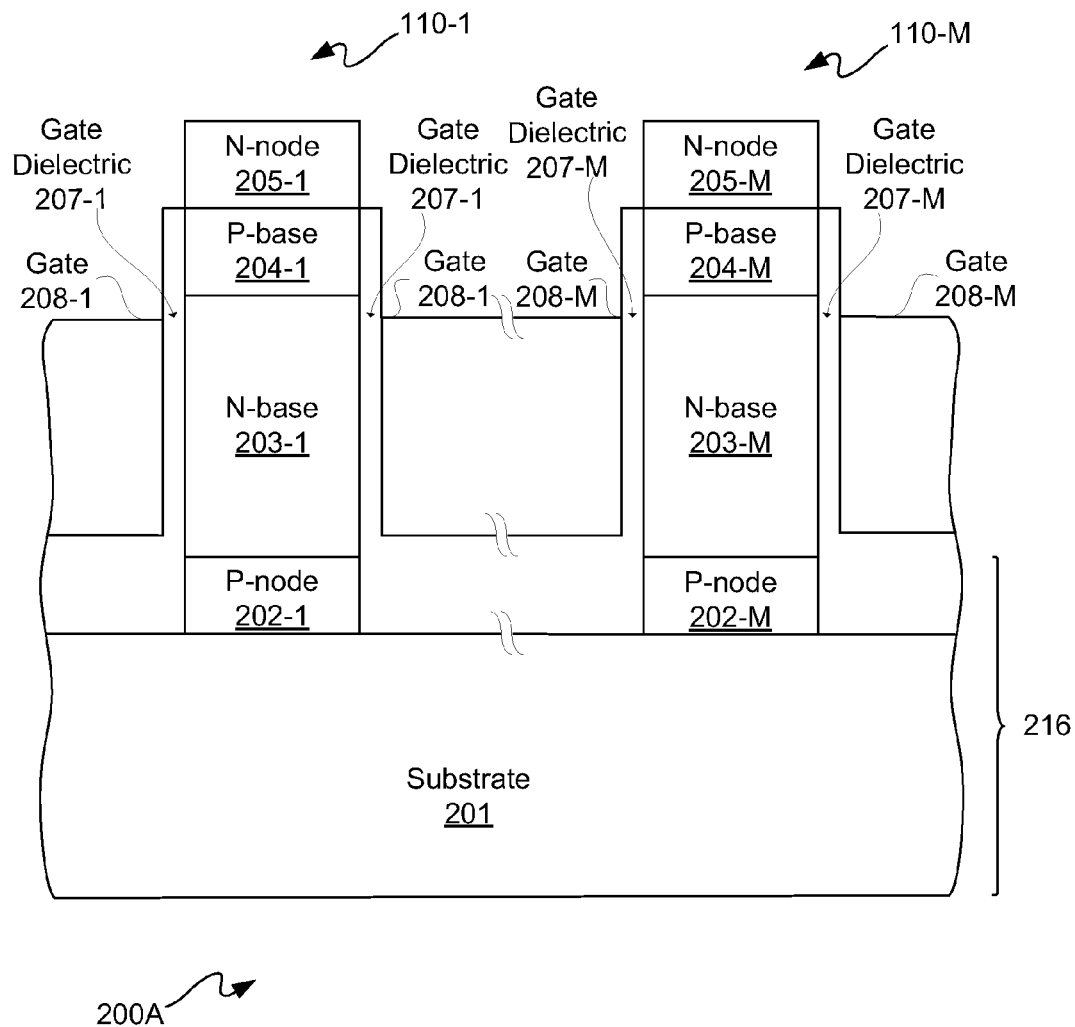
FIGS. 2A and 2B are side-view block diagrams depicting groupings of vertical thyristor-based memory cells of integrated circuits.

FIG. 2A is side-view block diagram depicting a grouping of vertical thyristor-based memory cells 110-1 through 110-M of an integrated circuit 200A. Gates 208-1 through 208-M are connected back-to-back in this cross-section taken along a WL2 102. If such cross-section were taken along a bitline 103, gates 208-1 through 208-M may not appear as being connected as such. Such memory cells 110 may be as described with reference to FIGS. 1A through 1D.

In this exemplary embodiment, vertical thyristor-based memory cells 110-1 through 110-M are depicted as being formed using a bulk semiconductor wafer 216, such as a silicon wafer for example. However, it should be understood that a bulk or semiconductor-on-insulator wafer, including a semiconductor other than silicon, may be used.

Along a top surface of semiconductor substrate 201 may be p-nodes 202-1 through 202-M, which may be a common plate of nodes. Accordingly, it should be understood that p-nodes 202-1 through 202-M may be WL1 101 of FIG. 1C. More particularly, it should be understood that p-nodes 202-1 through 202-M may be emitter nodes of thyristor-based memory cells 110-1 through 110-M, respectively. In this exemplary embodiment, p-nodes 202-1 through 202-M may be doped to be substantially p-type, and more particularly, may be doped to have a $p^+$ doping level.

Formed directly above each p-node may be a respective n-base. More particularly, n-bases 203-1 through 203-M are respectively formed above p-nodes 202-1 through 202-M. Located directly above n-bases may be p-bases. More particularly, p-bases 204-1 through 204-M may be respectively located above n-bases 203-1 through 203-M.

Along sidewalls of the p-n-p stacks of memory cells 110-1 through 110-M may be formed one or more gate dielectric layers, which are indicated as gate dielectrics 207-1 through 207-M so as to be associated with memory cells 110-1 through 110-M. It should be understood that in some embodiments, gate dielectrics 207-1 through 207-M may completely or partially surround p-n-p stacks of memory cells 110-1 through 110-M as well as being along sidewalls thereof.

One or more gate conductive layers may be formed between such p-n-p stacks, which are indicated as gates 208-1 through 208-M so as to be respectively associated with memory cells 110-1 through 110-M. Gates 208-1 through 208-M may be respectively separated from n-bases 203-1 through 203-M by gate dielectrics 207-1 through 207-M. Gates 208-1 through 208-M may be positioned for capacitively coupling to n-bases 203-1 through 203-M, respectively, during an activation operation and/or a precharge operation, as described below in additional detail.

Furthermore, n-nodes may be formed directly above p-bases. More particularly, n-nodes 205-1 through 205-M are respectively formed above p-bases 204-1 through 204-M as other emitter nodes. In this exemplary embodiment, n-nodes 205-1 through 205-M may be doped to be substantially n-type, and more particularly, may be doped to have an $n^+$ doping level.

Accordingly, each memory cell 110-1 through 110-M has a p-n-p-n stack structure. Additional details regarding the formation of vertical thyristor-based memory cells may be found in one or more of the above-referenced U.S. Patents.

Figure 2B:
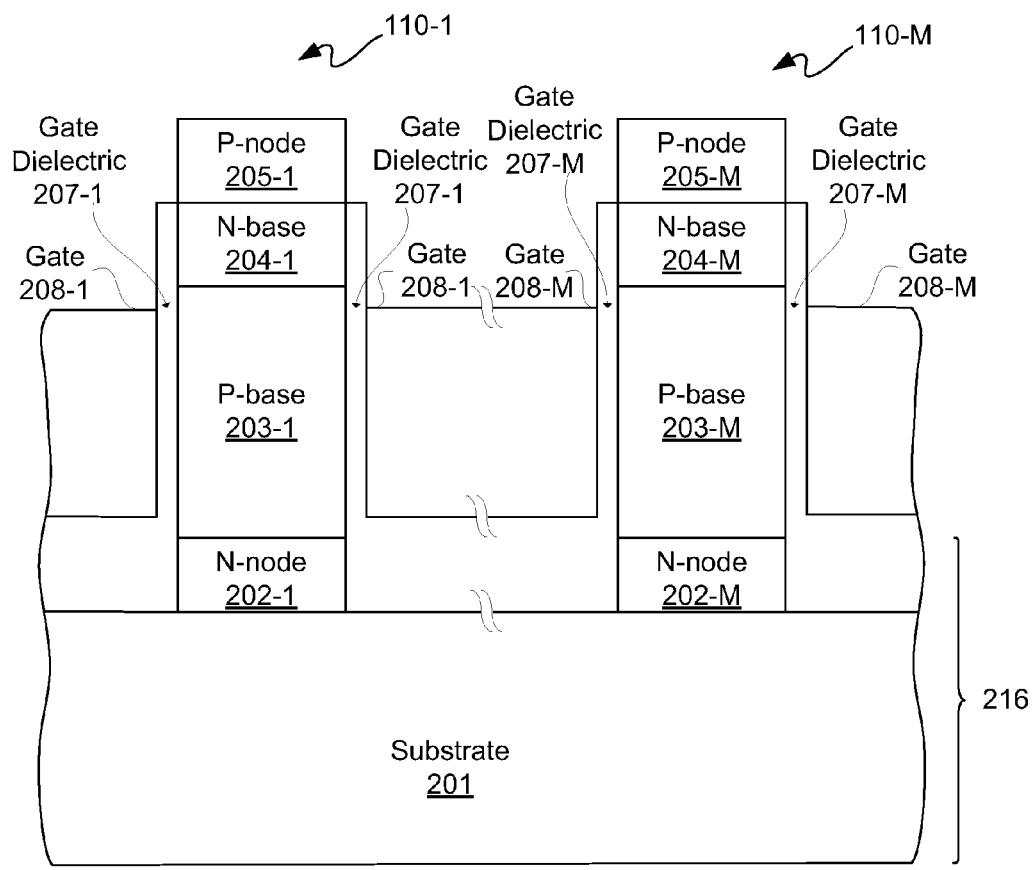

FIG. 2B is a side-view block diagram depicting another exemplary embodiment of vertical thyristor-based memory cells 110-1 through 110-M of an integrated circuit 200B. In this depicted exemplary embodiment, nodes or regions 202-1 through 202-M are n-type, namely n-nodes; bases 203-1 through 203-M are p-type, namely p-bases; bases 204-1 through 204-M are n-type, namely n-bases; and nodes 205-1 through 205-M are p-type, namely p-nodes. In this exemplary embodiment, n-nodes 202-1 through 202-M may be doped to be substantially n-type, and more particularly, may be doped to have an $n^+$ doping level. Furthermore, in this exemplary embodiment, p-nodes 205-1 through 205-M may be doped to be substantially p-type, and more particularly, may be doped to have a $p^+$ doping level. Thus it should be understood that memory cells 110-1 through 110-M of integrated circuit 200B of FIG. 2B have n-p-n-p stack structures.

It should be understood that either sets of nodes 202 or 205 may be coupled to one another to form a "common plate" structure. Accordingly, it should be understood that p-n-p-n or n-p-n-p structures with rows or columns of memory cells having a common plate architecture may be used.

Figure 2C:
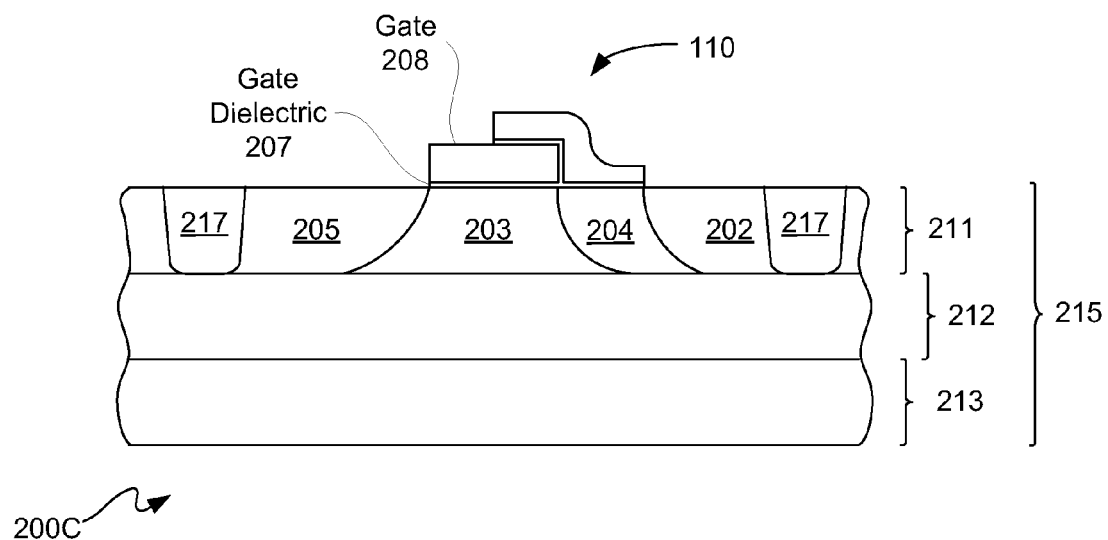
FIGS. 2C and 2D are side-view block diagrams depicting lateral thyristor-based memory cells in semiconductor-on-insulator and bulk integrated circuits, respectively.

FIG. 2C is a side-view block diagram depicting an exemplary embodiment of an integrated circuit 200C having a lateral memory cell 110. In this exemplary embodiment, lateral memory cell 110 is formed on a semiconductor-on-insulator ("SOI") wafer 215 having an active semiconductor substrate layer ("active layer") 211, an insulator layer such as a buried oxide ("BOX") layer 212, and a bottom support substrate layer 213. In active layer 211 are formed a first base 203, a second base 204, and first emitter region 202, and a second emitter region 205. First base 203 may be p-type or n-type as previously described. Second base 204 may be p-type or n-type, as previously described, namely opposite the type of first base 203.

Likewise, first emitter region or node 202 adjacent to second base 204 is of an opposite type of doping than such adjacent base region. Emitter region or node 205 adjacent to first base 203 is likewise of an opposite type doping with respect to such adjacent base region.

A gate dielectric layer providing a gate dielectric 207 may be located directly above a top surface of first base 203, as well as above second base 204. A gate layer providing gate 208 may be located directly above an upper surface of gate dielectric 207. Cells 110 may be separated from one another with isolation regions 217, such as shallow trench isolation ("STI") regions. Some other details regarding formation of lateral thyristor-based memory cells 110 may be found in one or more of the above-referenced U.S. Patents.

Figure 2D:
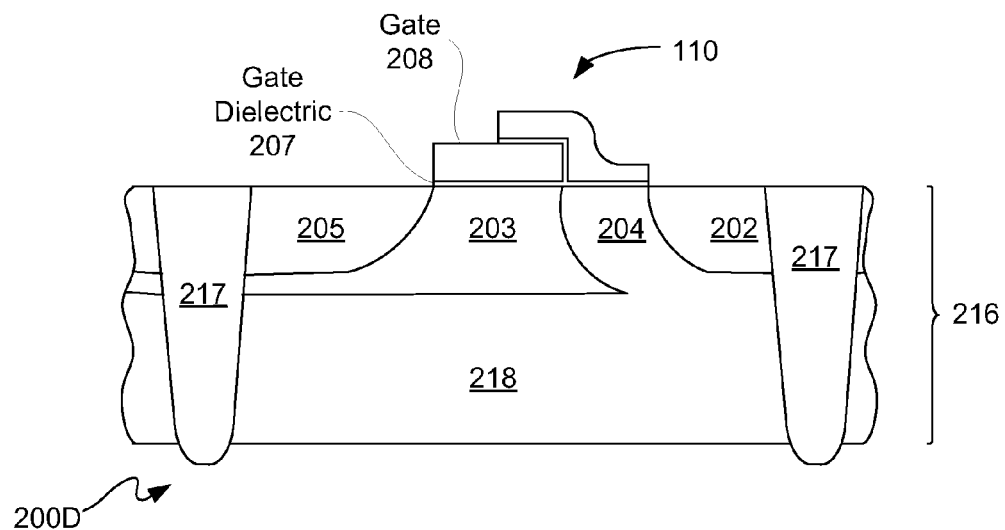

FIG. 2D is a side-view block diagram depicting another exemplary embodiment of a lateral thyristor-based memory cell 110 in an integrated circuit 200D. In this exemplary embodiment, a bulk semiconductor wafer ("substrate") 216 is used for formation of lateral thyristor-based memory cell 110. Isolation regions 217 are formed in substrate 216. Such isolation regions may be STI regions. First base 203 in this exemplary embodiment is formed such that it extends directly above a lightly doped portion 218 of substrate 216, as well as has a portion that extends directly underneath emitter region or node 205. Adjacent to first base 203 may be second base 204, and second base 204 may be contiguous with lightly doped portion 218 and may have a more concentrated doping of a p- or n-type. A portion of second base 204 may extend directly underneath emitter region or node 202. In another embodiment, lightly doped portion 218 may border emitter node 202. Gate dielectric 207 and gate 208 are as previously described with reference to FIG. 2C.

In the following description it shall be apparent that vertical or lateral thyristor-based memory cells 110 may be used, whether such cells are formed using a bulk semiconductor wafer or an SOI wafer. However, for purposes of clarity by way of example and not limitation, it shall be assumed that vertical thyristor-based memory cells are used. Moreover, it shall be assumed that such vertical thyristor-based memory cells are formed using a bulk semiconductor substrate and have a p-base as a first base, namely the base directly located along side a majority of gate 208. Thus it shall be assumed for purposes of clarity and not limitation that an n-p-n-p structure for thyristor-based memory cells 110 is used.

The following embodiments of sense amplifiers may be used with a memory array of thyristor-base memory cells having a p-base as the first base for each of the cells thereof. Such memory array may or may not be a "common-plate" structure. Furthermore, operations associated with the following embodiments of sense amplifiers are described for Double Data Rate ("DDR") applications, such as DDR3 for example. However, it will be appreciated from the following description that such sense amplifiers are not limited to DDR3, but may be used in other applications.

For DDR3, four states may be identified, namely an idle state, an activate or open state, a read/write state, and a precharge state. During an idle state, no activating, reading, writing, or precharging takes place. During an activate or open state, a wordline is activated for access to cells associated therewith. A read/write state is for reading or writing from/to a memory array, and a precharge state is for closing a wordline. Thus, for example, an address may be received causing a wordline, or row of cells, to be accessed, namely read all cells of such row into associated sense amplifiers, in advance of a write or read operation to such address. After the activate state for such address access, a read or write to such address may take place during a read/write state. Reading out data may thus be shifting out data read from sense amplifiers for data obtained by such sense amplifiers during the activate state. After such read/write state, such wordline or row opened during the activate state may be closed. Closing a wordline or row effectively means writing read data in the sense amplifiers back to the memory cells of the wordline or row. For a write operation, such a write shifts data into the sense amplifiers; however, such data is not written back into the cells until the row or wordline is closed, namely during a precharge state.

In the following descriptions of exemplary embodiments, even though specific types of transistors are described and depicted, it should be understood that transistors of opposite polarity type may be implemented. For purposes of clarity, nodes and signals at such nodes, as well as lines and the signals on such lines, are given the same reference number.

Figure 3:
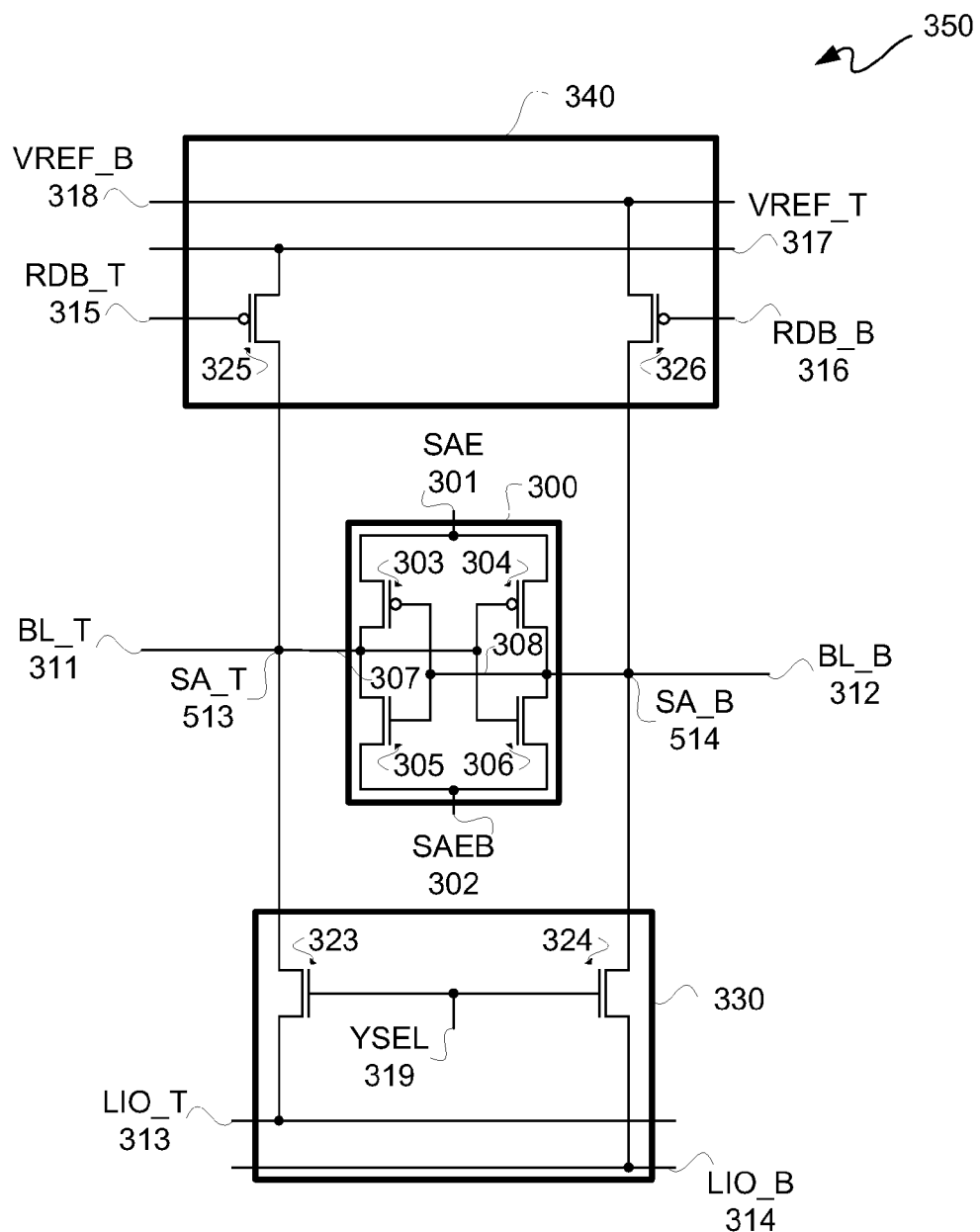

FIG. 3 is a circuit diagram depicting an exemplary embodiment of a sense amplifier 350. Sense amplifier 350 includes a read-precharge-reference voltage ("reference") circuit 340, a latch circuit 300, and a select input/output ("I/O") circuit 330. The nomenclature "T" and "B" indicates correspondence to a "top" bitline and "bottom" bitline respectively.

Reference circuit 340 includes p-type transistors 325 and 326. A source node of transistor 325 is coupled to receive top reference voltage 317, and a source node of p-type transistor 326 is coupled to receive bottom reference voltage 318. P-type transistor 325 is gated with a top "readbar" ("RDB") signal 315 and p-type transistor 326 is gated with a bottom "readbar" signal 316. A "readbar" is a complement signal of a read signal, namely an active low signal. A drain node of p-type transistor 325 is coupled to a sense amplifier node 513, and a drain node of p-type transistor 326 is coupled to a sense amplifier node 514, where sense amplifier node 514 is a complement node to sense amplifier node 513.

Sense amplifier nodes 513 and 514 are respectively coupled to top and bottom bitlines 311 and 312. Sense amplifier node 513 is an input node of an inverter formed by transistors 303 and 305 of latch 300 and an output node of an inverter formed by transistors 304 and 306 of latch 300. Sense amplifier node 514 is an input node of the inverter formed by transistors 304 and 306 of latch 300 and an output node of the inverter formed by transistors 303 and 305 of latch 300.

Accordingly, it should be understood that latch 300 is formed by cross-coupled inverters. More particularly, a p-type transistor 303 and a p-type transistor 304 each have a source node coupled to a sense amplifier enable node 301 for receiving a sense amplifier enable signal 301. Source nodes of n-type transistors 305 and 306 are coupled to sense amplifier enable node 302 for receipt of sense amplifier enable signal 302, where sense amplifier enable signal 302 is a complement signal to sense amplifier enable signal 301 when the sense amplifier is asserted or activated. Drain nodes of transistors 303 and 305 are connected to one another at sense amplifier node 513. Gate nodes of transistors 303 and 305 are connected to one another at sense amplifier node 514. Drain nodes of transistors 304 and 306 are connected to one another at sense amplifier node 514, and gate nodes of transistors 304 and 306 are connected to one another at sense amplifier node 513.

Select input/output ("I/O") circuit 330 is coupled to receive a column select signal ("YSEL") 319. Select I/O circuit 330 includes n-type transistors 323 and 324 having gates coupled to receive column select signal 319. A drain node of n-type transistor 323 is coupled to sense amplifier node 513, and a drain node of n-type transistor 324 is coupled to sense amplifier node 514. A source node of n-type transistor 323 is coupled to a top line I/O node 313 for top line I/O signal 313. A source node of n-type transistor 324 is coupled to a bottom line I/O node 314 for bottom line I/O signal 314.

It should be understood that bitlines 311 and 312 may be of bitlines 103 of FIGS. 1A and/or 1C. It should further be understood that bitlines 311 and 312 are directly respectively coupled to sense amplifier nodes 513 and 514. Thus, bitline capacitances are directly coupled, namely without any pass gating, to sense amplifier nodes. Below described embodiments have pass gating for coupling of bitlines and sense amplifier nodes to reduce power consumption by reducing a duration of cell current flow in active rows and reducing toggled capacitances during operation of latch circuit 300.

Figure 4:
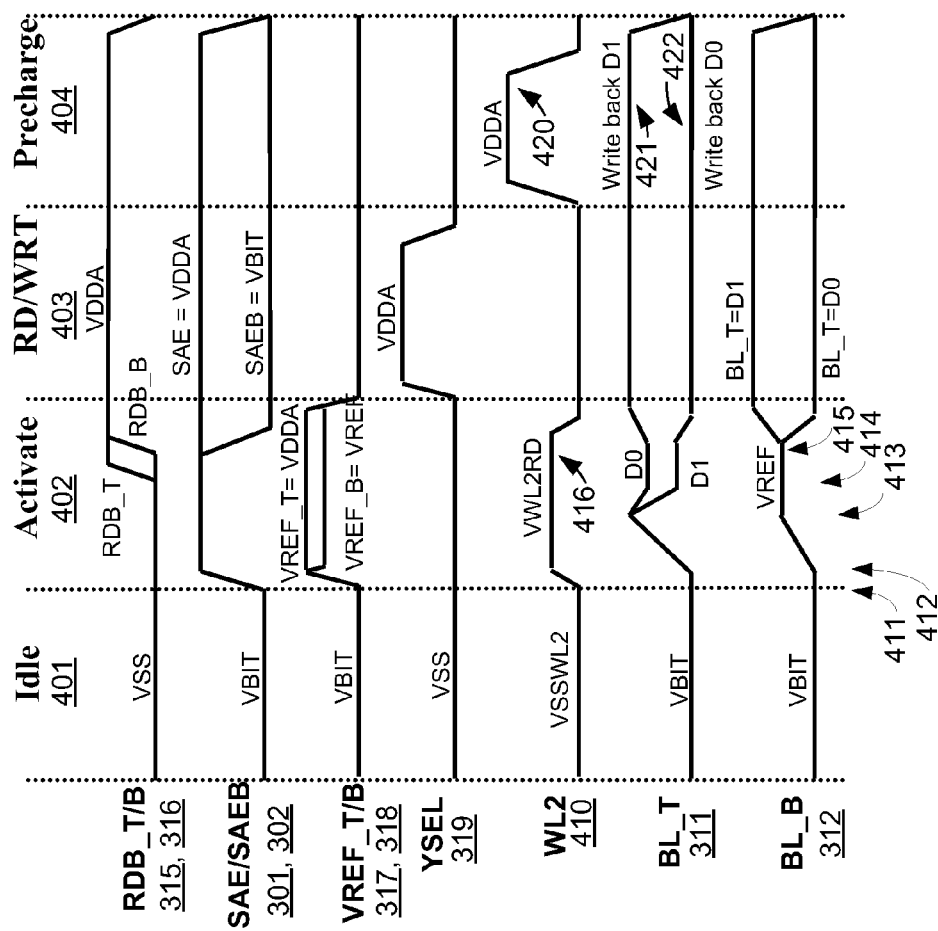

FIG. 4 is a signal diagram depicting an exemplary embodiment of DDR3 operations 400 for sense amplifier 350 of FIG. 3. With simultaneous reference to FIGS. 3 and 4, operations 400 are further described. For purposes of clarity by way of example and not limitation, some signals have been combined in the signal diagram of FIG. 4, and where those signals diverge is indicated. Additionally, it should be understood that operations 400 are for a inverting read-modify-write sequence, such as an inverting refresh, as described in additional detail in a co-pending patent application "Tracking for Read and Inverse Write Back of a Group of Thyristor-based Memory Cells" by Farid Nemati, filed on the same date hereof, assigned application Ser. No. 13/172,6330, which is incorporated herein in its entirety for all purposes.

There are four states of operations 400, namely idle state 401, activate state 402, read or write ("RD/WRT") state 403, and precharge state 404. Signals in states 401 through 404 may be at different voltage levels, as described below in additional detail. For purposes of clarity by way of example and not limitation, it should be understood that the voltage level VDDA, namely an anode supply voltage level, may in a range of approximately 1.2 to 1.5 volts. A bit voltage level ("VBIT") may be in a range of approximately 0.3 to 0.5 volts. A ground or Vss voltage level may be at approximately 0 volts. A WL2 Vss level ("VSSWL2") may be at approximately −2 to −0.5 volts. A WL2 read voltage, namely "VWL2RD", may be approximately 0 to 1.5V above VSSWL2. A reference voltage ("VREF") may be approximately 50 to 300 millivolts below VDDA. A data 0 state bitline write voltage ("D0") may stabilize at a VBIT voltage level and a data 1 state bitline write voltage ("D1") may stabilize at a VDDA voltage level. The example voltage levels are for thyristor-based memory cells have a first base of a p-type. Other voltage levels for thyristor-based memory cells having a first base of an n-type may be used with respect to VBIT being in a range of approximately 1.0 to 1.2 volts, a WL2 standby or idle level being approximately 2 to 3 volts, VWL2RD being approximately 0 to 1.5 volts below a WL2 standby level, and other voltage levels, as may vary from application to application. It should be understood that use of negative voltage may be avoided with thyristor-base memory cells having a first base of an n-type. It should further be understood that these or other voltage values may be used.

It should generally be understood that p-type transistors 325 and 326 are in a substantially conductive state ("ON") for voltage level Vss and are in a substantially non-conductive state ("OFF") for voltage level VDDA. It should further generally be understood that n-type transistors 323 and 324 are OFF at voltage level Vss and ON at voltage level VDDA.

During idle state 401, readbar signals 315 and 316 are at Vss, sense amplifier enable signals 301 and 302 are at VBIT, reference voltage signals 317 and 318 are at VBIT, column select signal 319 is at Vss, WL2 signal 410 is at VSSWL2, top bitline signal 311 is at VBIT, and bottom bitline signal 312 is at VBIT.

In idle state 401, sense amplifier nodes 513 and 514 are coupled to VREF signal 317 and VREF signal 318, respectively, as transistors 325 and 326 are ON. Furthermore, it should be understood that transistors 323 and 324 during idle state 401 and activate state 402 are OFF. Thus both sense amplifier nodes 513 and 514 are at VBIT voltage, as well as associated bitline voltages. Furthermore, sense amplifier enable signals 301 and 302 are at VBIT voltages creating a neutral or balanced state for latch 300.

It should be understood that WL2 is separated from a p-base, which is a first base in this exemplary embodiment, by a gate dielectric. Pulsing WL2 may be used for capacitively coupling to such p-base. Such pulsing of WL2 is described herein throughout several embodiments as occurring during activate and precharge operations for respectively opening and closing access to a group of thyristor-based memory cells.

During active state 402, WL2 voltage 410 transitions from VSSWL2 to VWL2RD, generally at time 411. Also generally at time 411, sense amplifier enable signals 301 and 302 transition from VBIT to VDDA, and voltage reference signals 317 and 318 transition to VDDA. Shortly after time 411, reference voltage signals 317 and 318 are at separate levels, namely top reference voltage 317 stays at approximately VDDA and bottom reference voltage signal 318 drops down to VREF which is between VDDA and VBIT.

Generally at time 412, reference voltages 317 and 318 transition to separate voltage levels during activate state 402. Generally at time 412, bitline voltages of bitline signals 311 and 312 start transitioning during activate state 402. During activate state 402, column select signal 319 is held at Vss. Generally at time 413, bitline signal 312 has transitioned to a reference voltage level, namely VREF, and generally at time 413, bitline voltage 311 may transition to a peak voltage level prior to transitioning to a data voltage level. Both D0 and D1 voltage levels are indicated for top bitline voltage signal 311; however, only one of those signals is present at a time. Likewise, both D0 and D1 voltage levels are indicated for bottom bitline voltage signal 312; however, only one of those signals is present at a time.

During activate state 402, transistors 325 and 326 are left ON up until about time 414 and later at time 415 when top readbar signal 315 and bottom readbar signal 316, respectively, are allowed to transition to VDDA. However, during this time, reference voltage coupled to sense amplifier nodes 513 and 514 is respectively VDDA and VREF. Furthermore, during activate state 402, sense amplifier nodes 301 and 302 are brought to VDDA. Generally at time 415 with the shutting off of transistors 325 and 326, sense amplifier enable signal 301 stays at VDDA and sense amplifier enable signal 302 transitions to a VBIT voltage level. This allows D0 and D1 states to be separated out by latch 300 as indicated with respect to activate state 402 and D0 and D1 voltage values, either of which may be on bitlines 311 and 312. Thus, if there is a D0 voltage on bitline signal 311, then bitline 312 transitions to a D1 voltage level, and vice versa.

It should be understood that a D0 is a higher voltage level than a D1. During activate state, bitline voltage on a reference bitline, namely bitline signal 312, is set to VREF for transitioning either up to a D0 state when bitline signal 311 is a D1 state or down to a D1 state when bitline signal 311 is a D0 state. Thus, during activate state 402, a group of cells may be opened and data states associated therewith may be provided to associated sense amplifiers, such as multiple instances of sense amplifier 350. Such group of cells may be a row or a column of cells of an array of thyristor-based memory cells.

WL2 signal 410 is transitioned back to VSSWL2, generally starting at time 415 in activate state 402. A VWL2RD pulse of WL2 signal 410 during activate state 402 is for example to open a row.

During a read or write state 403, readbar signals 315 and 316 are held at VDDA, and sense amplifier signals 301 and 302 are held at VDDA and VBIT, respectively. For a read or write state 403, VREF signals 317 and 318 transition to VBIT voltage, and column select signal 319 is transitioned to VDDA. Accordingly, transistors 325 and 326 are OFF and transistors 323 and 324 are ON.

For read/write state 403, bitline signals 311 and 312 are at opposite data voltage levels. These data states are VBIT and VDDA, however the voltage level associated with these data states is inverse with respect to bitlines 311 and 312. It should be understood that an arbitrary number and sequence of read and/or write states can occur in between activate and precharge states. In a read state, data is transferred from sense amplifier nodes 513 and 514 to IO lines 313 and 314 to be sent out of the memory array. In a write state, data is transferred from IO lines 313 and 314 into sense amplifier nodes 513 and 514 to be written back into memory cells during a precharge state. Such write states may change the voltages on bitlines 311 and 312 to the opposite data state although such an example is not shown in FIG. 4.

For precharge state 404, readbar signals 315 and 316, sense amplifier enable signals 301 and 302, and VREF signals 317 and 318 may be held from their voltage values during read/write state 403. Likewise, bitline signals 311 and 312 may be held at their respective data states from the end of activate state 402, except that a write back operation of the opposite data state is performed. For example, if during an activate state 402, bitline signal 311 is D0, then a write back of a D1 421 is performed. For such a write back, WL2 signal 410 is transitioned to VDDA. Voltage levels other than VDDA can also be used. In general a voltage level 2 to 4 volts above VSSWL2 may be used. This transitioning or pulsing of WL2 signal 410 to VDDA for writing to a thyristor-based memory cell is for the example of cells with a first base of a p-type. All cells of a row for example may be closed after writing back opposite data states by transitioning VDDA pulse 420 back down to VSSWL2 toward the end of precharge state 404.

Likewise, during precharge state 404, if data from read/write state 403 is a D1 level, then a write back of a D0 422 is performed during precharge state 404. As indicated with reference to signals 301, 302, 311, 312, 315, and 316, such signals may transition to their idle state 401 values at the end of precharge state 404.

Accordingly, it should be understood that for a common plate with a first base of a p-type, WL1 is coupled to Vss for all WL1s in an array or subarray thereof. By subarray it is generally meant an array of dimension (x, y) where x is greater than or equal to 2 and y is greater than or equal to 2. Thus access of a row for example is obtained by pulsing WL2 as indicated by pulse 416. It should be understood that a common plate structure of a thyristor-based array of memory cells may be used in embedded as well as discrete memory applications.

Figure 15:
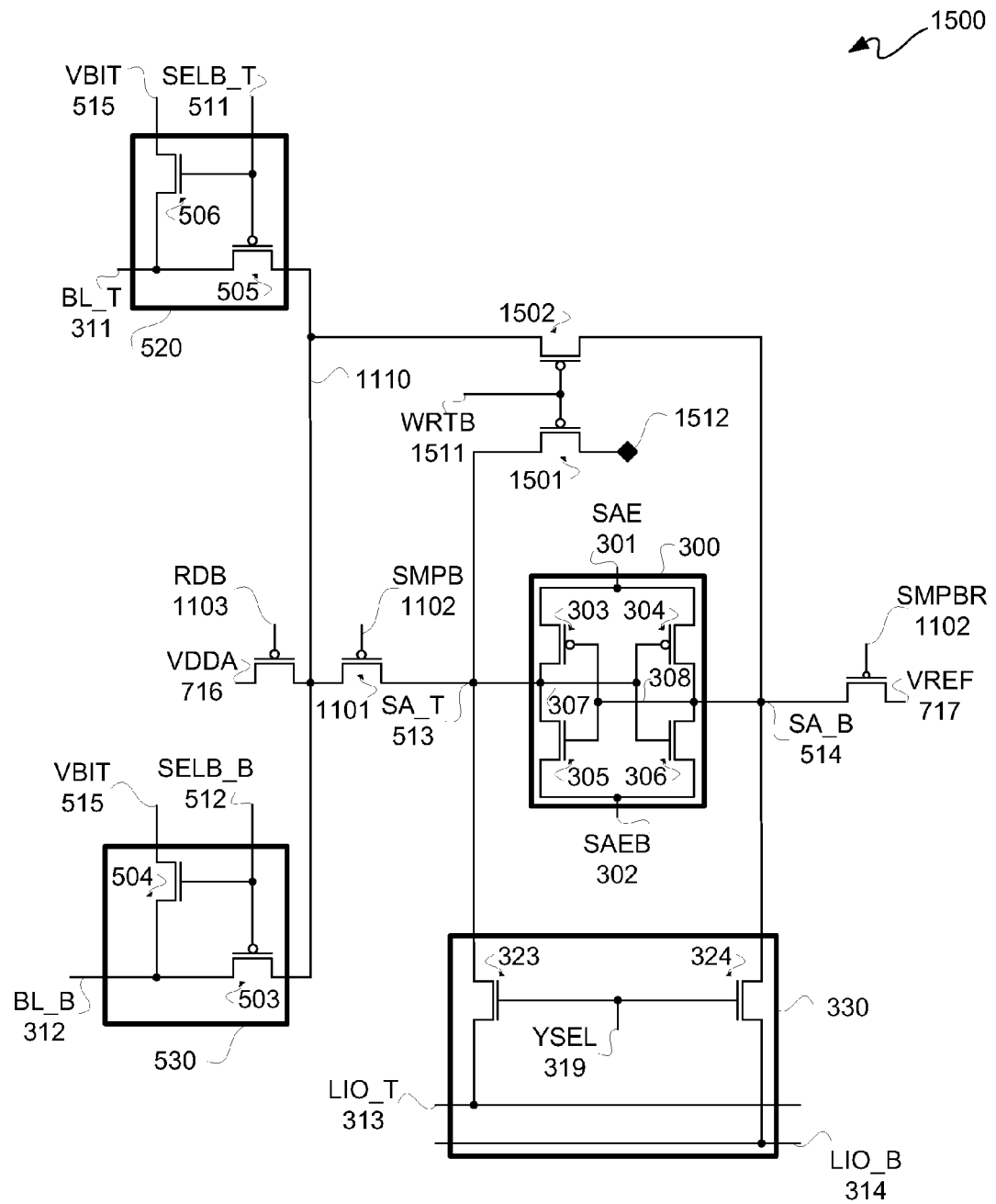

A thyristor-based memory cell may effectively be an "inverting" memory cell, as described in the above-referenced co-pending patent application, which is incorporated by reference herein in its entirety for all purposes. A read and invert write back sequence, such as inverting refresh, may be used as described herein, where an opposite data state of that read is written back. All the sense amplifier embodiments described herein are for an inverting read-modify-write, except for sense amplifier 1500 of FIG. 15. Sense amplifier 1500 of FIG. 15 is for a non-inverting read and write back, such as a non-inverting refresh.

Figure 5:
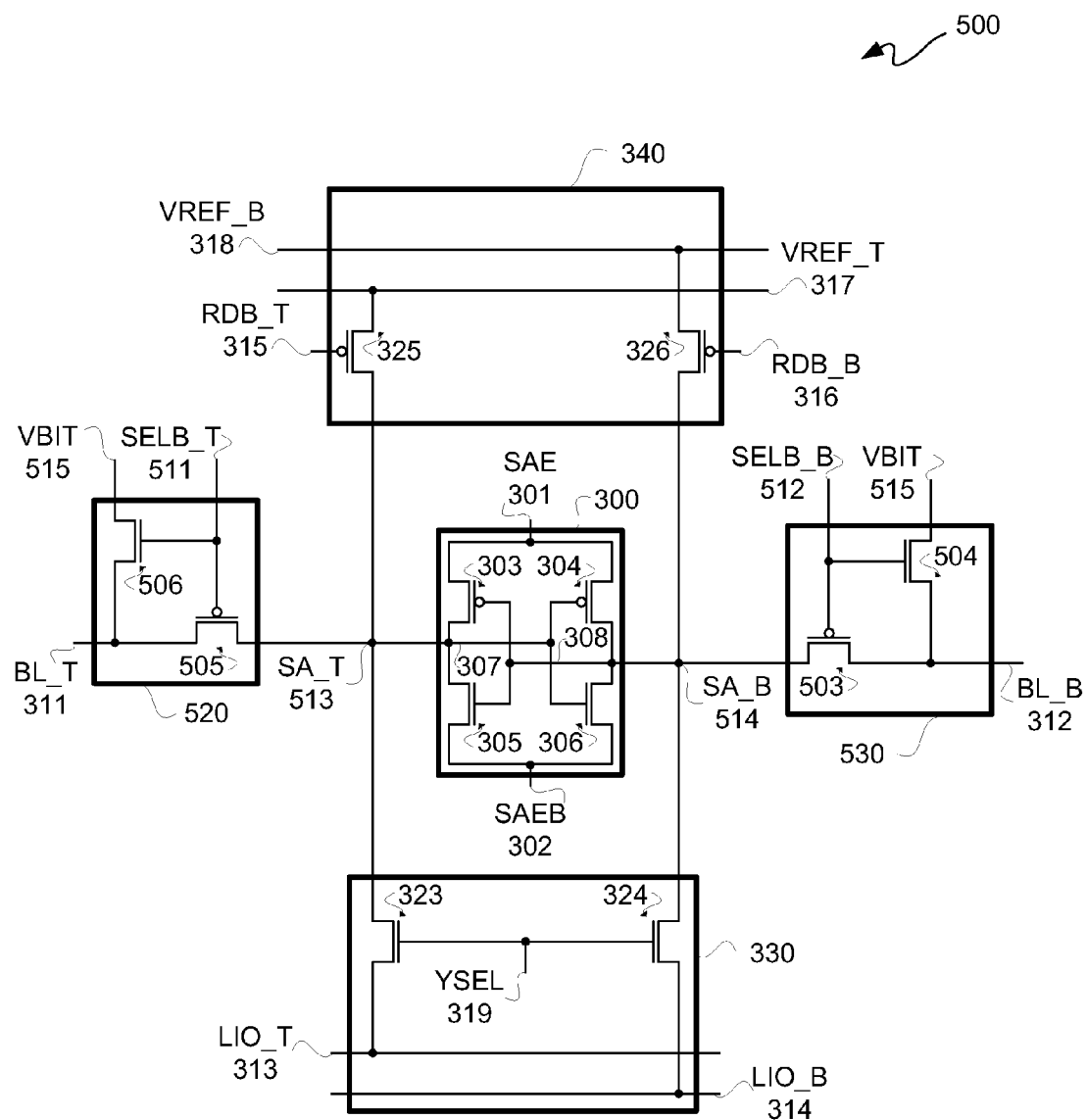

FIG. 5 is a circuit diagram depicting an exemplary embodiment of a sense amplifier 500. Sense amplifier 500 is similar to sense amplifier 350 of FIG. 3, and thus only the differences are described herein for purposes of clarity. Coupled at sense amplifier nodes 513 and 514 are a first bit voltage select circuit 520 and a second bit voltage select circuit 530, respectively. It should be understood that for sense amplifier 500 bitlines 311 and 312 are not directly coupled to sense amplifier nodes or sense nodes 513 and 514, respectively. Rather, pass gate transistors 505 and 503 are used for such coupling as described below in additional detail. However, it should be understood that using pass gates reduces the effective capacitance seen at sense amplifier nodes 513 and 514. In other words, bitline capacitances are not directly coupled to sense nodes. Such pass gates thus may reduce power consumption by reducing duration of cell current flow in active rows and by reducing toggled capacitances during operation of latch circuit 300

Bit voltage select circuit 520 includes n-type transistor 506 and p-type transistor 505. A source/drain node of p-type transistor 505 is coupled to sense amplifier node 513, and another source/drain node of p-type transistor 505 is coupled to bitline 311. A source/drain node of n-type transistor 506 is coupled to bitline 311, and another source/drain node of n-type transistor 506 is coupled to receive bit voltage ("VBIT") 515. Gates of transistors 505 and 506 are coupled to receive a top select bit signal 511.

Bit voltage select circuit 530 includes p-type transistor 503 and n-type transistor 504 and is likewise configured with respect to bit voltage select circuit 520, with the following differences. A source/drain node of p-type transistor 503 is coupled to sense amplifier 514, and another source/drain node of p-type transistor 503 is coupled to bitline 312. A source/drain node of n-type transistor 504 is coupled to bitline 312. Gates of transistors 503 and 506 are coupled to receive a bottom select bit signal 512.

Figure 6A:
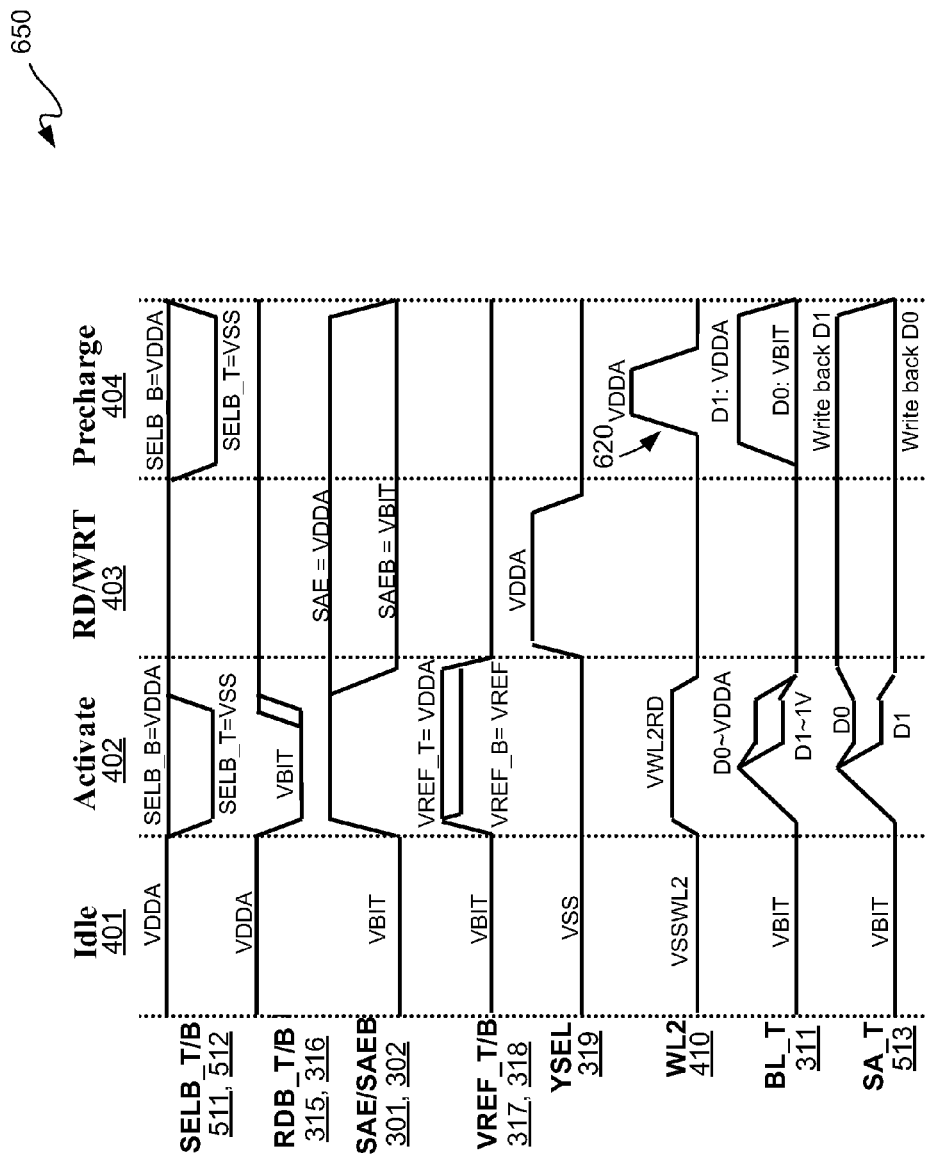

FIG. 6A is a signal diagram depicting an exemplary embodiment of DDR3 operations 650 for sense amplifier 500 of FIG. 5. As some of operations 650 are the same as operations 400 of FIG. 4, generally only differences are described for purposes of clarity. Operations 650 are described with simultaneous reference to FIGS. 5 and 6A.

During idle state 401, readbar signals 315 and 316 are held at VDDA. Select signals 511 and 512 are likewise held at VDDA. Sense amplifier signal 513 is the same bitline signal 311 of FIG. 4. Bitline signal 311 of FIG. 6A is different than bitline signal 311 of FIG. 4 in terms of states 402 through 404.

During activate state 402, select signal 511 is brought down to Vss and select signal 512 is held at VDDA. With select signal 511 being brought to Vss, transistor 505 is ON and transistor 506 is OFF. With select signal 512 being at VDDA, transistor 503 is OFF and transistor 504 is ON.

Accordingly, sense amplifier node 514 is decoupled from bottom bitline 312, and hence operation of bitline signal 312 is not described with reference to operation 650. Furthermore, sense amplifier signal 513 is coupled to top bitline signal 311 as p-type transistor 505 is ON during activate state 402. Furthermore, bitline 311 is decoupled from bit voltage 515 as transistor 506 is OFF during activate state 402.

During activate state 402, readbar signals 315 and 316 are transitioned down from VDDA to a VBIT voltage level. Later during activate state 402, readbar signal 315, and shortly thereafter readbar signal 316, are transitioned back to VDDA. Bitline signal 311 after being decoupled from bit voltage 515 may be allowed to transition up to a peak D0 state of approximately VDDA, or pulled down to a D1 state, which in this exemplary embodiment is approximately 1 volt. Toward the end of a cycle of activate state 402, bitline signal 311 may be pulled down to a VBIT voltage level.

During read/write state 403, select signals 511 and 512 are held at VDDA. Likewise, readbar signals 315 and 316 are held at VDDA, as was previously described with reference to FIG. 4. During read/write state 403, bitline signal 311 may be held at a VBIT voltage level.

During precharge state 404, select signal 511 is transitioned to Vss and select signal 512 is held at VDDA, as was done during activate state 402. Readback signals 315 and 316 are maintained at VDDA, was previously described with reference to FIG. 4.

In contrast to WL2 410 operation of FIG. 4, during precharge state 404 a pulse of WL2 signal 410 is applied; however, such pulse 620 is narrower than pulse 420 as indicated in FIG. 4 so that WL2 pulse is contained within the period that bitline 311 is at a write back voltage. During precharge state 404, for a D1 state, bitline signal 311 transitions to VDDA, namely represents a VDDA pulse. However, for a D0 state, bitline signal 311 is maintained at a VBIT voltage level.

Figure 6B:
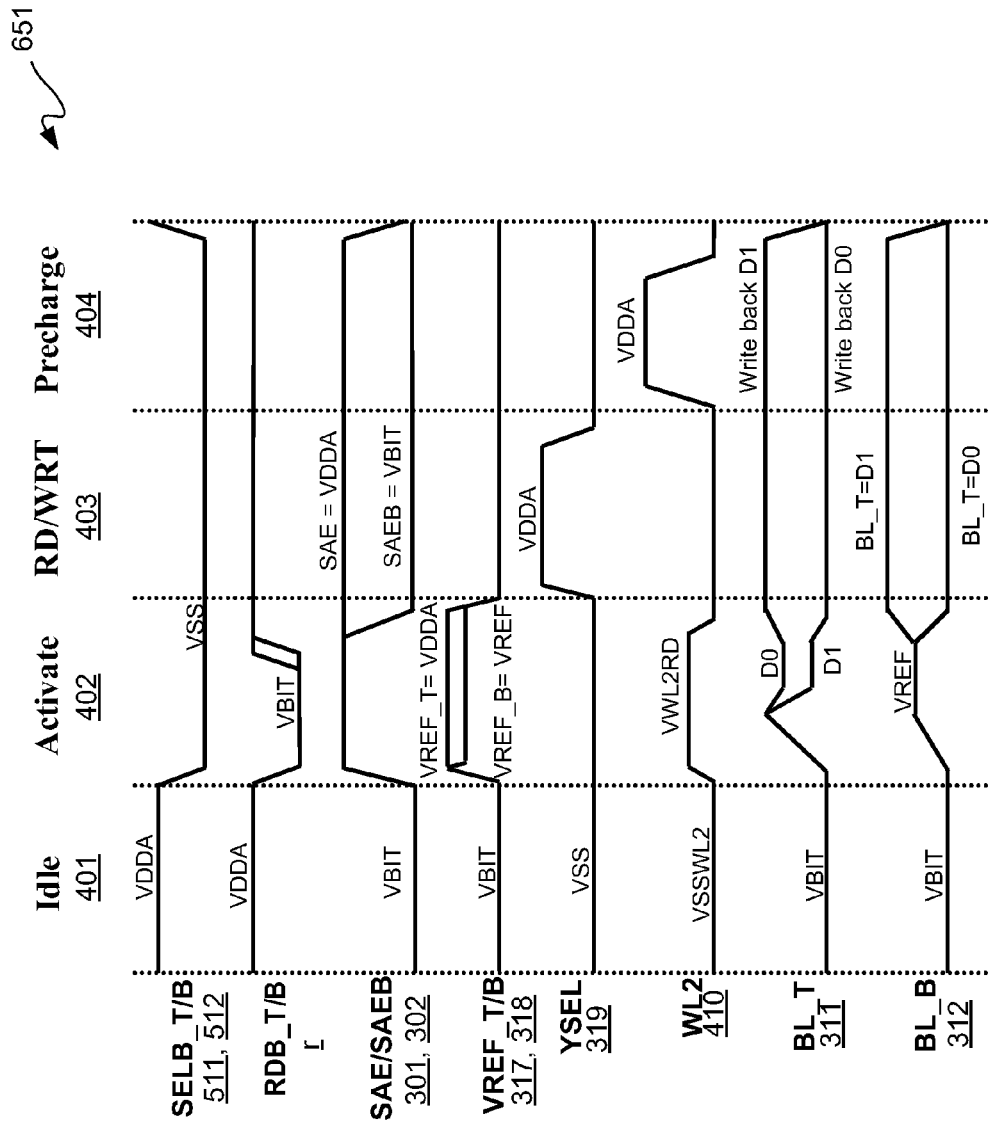

FIG. 6B is a signal diagram depicting another exemplary embodiment of DDR3 operations 651 for sense amplifier 500 of FIG. 5. Operations 651 are an option for operating sense amplifier 500. Again, as some of the operations 651 are the same as operations 400 of FIG. 4, only the differences as described for purposes of clarity. Operations 651 are described with simultaneous reference to FIGS. 5 and 6B.

The only difference between operations 400 of FIG. 4 and operations 651 of FIG. 6B, are with respect to readbar signals 315 and 316, and select signals 511 and 512. Readbar signals 315 and 316, however, of FIG. 6B are the same as readbar signals 315 and 316 of FIG. 6A. Thus, generally only top and bottom select signals 511 and 512 are described below for purposes of clarity.

During idle state 401, select signals 511 and 512 are held at VDDA. During activate state 402, select signals 511 and 512 are transitioned to Vss. Accordingly, both p-type transistors 503 and 505 are turned ON, coupling bitlines 312 and 311 to sense amplifier nodes 514 and 513, respectively. Such signals 511 and 512 are held at Vss for activate state 402, read/write state 403, and precharge state 404, and at the end of precharge state 404 may transition back to VDDA, such as for a subsequent idle state.

With simultaneous reference to FIGS. 4, 6A, and 6B, for a p-TCCT cell, a write of a D0 is generally at VBIT, a read of D0 may be generally at VDDA, a write of a D1 is generally at VDDA, and a read of a D1 may start at VDDA and may gradually taper off toward VBIT. So, it should be understood that bitline voltages do not transition as much as in the past because opposite data state voltages are used for writing back data. For purposes of clarity by way of example and not limitation, it will be assumed for a top bitline 311 that a read of a D1 and a write of a D0 generally is at VBIT for operations described herein and that a read of a D0 and a write of a D1 generally is at VDDA for operations described herein. Accordingly, if a read of a D1 occurs on top bitline 311 at VBIT, then a read voltage level on bottom bitline 312 is VDDA, and if a read of a D0 occurs on top bitline 311 at VDDA, then a read voltage level on bottom bitline 312 is VBIT. Thus, for example, it should be understood that sense amplifier sense node voltage is not transitioned much, if at all, from a read of D1 generally at VBIT to a write back of D0 at VBIT and may not be transitioned at all from a read of D0 at VDDA to a write back of D1 at VDDA. By avoiding or reducing transitioning from D1 to D0 or from D0 to D1 voltage levels for writing back data, a read-modify-write, a refresh, or other memory read and write back operation may consume less power than in the past.

It should further be understood that because an opposite data state is written back, state of data written back is tracked, namely to indicate whether such data is inverted or not as stored in memory. For example, data having been cycled an odd number of times may be in an inverted state, and data having been cycled an even number of times may be a non-inverted or an original state. Tracking of data state or "polarity" is described in additional detail in the above-referenced co-pending patent application, which is incorporated herein in its entirety for all purposes.

Figure 7:
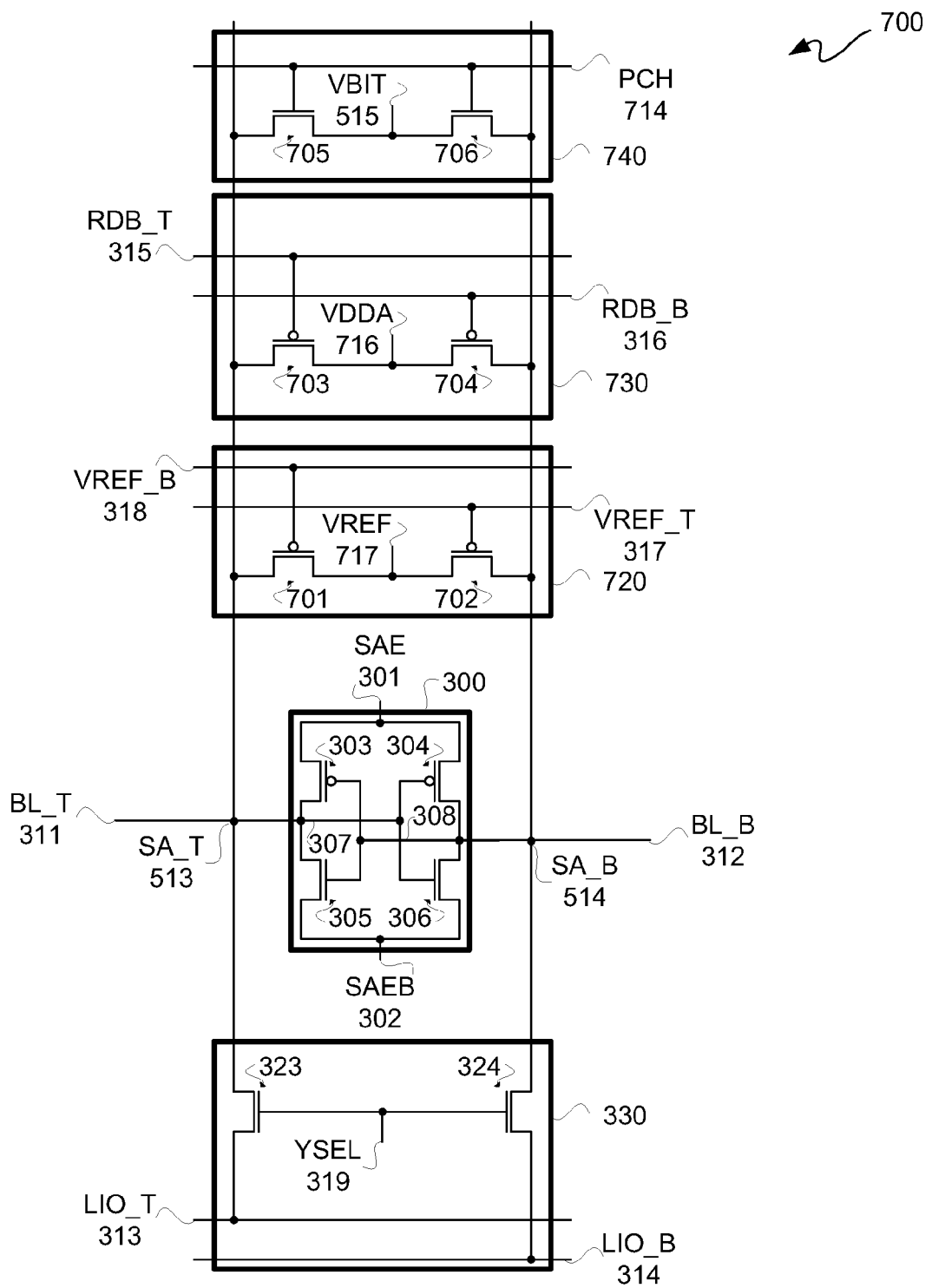

FIG. 7 is a circuit diagram depicting an exemplary embodiment of a sense amplifier 700. Sense amplifier 700 is the same as sense amplifier 350 of FIG. 3, except that reference circuit 340, which pass gates reference voltages 317 and 318 to sense amplifier nodes 513 and 514, respectively, is replaced with reference voltage circuit 720, read reference voltage ("read") circuit 730, and bit voltage (e.g., VBIT) select circuit 740. Sense amplifier nodes 513 and 514 are commonly coupled to circuits 720, 730, and 740.

Reference voltage circuit 720 includes p-type transistor 701 and 702 commonly coupled in source-source series to receive VREF voltage 717. A drain node of transistor 701 is directly coupled to sense amplifier node 513, and a drain node of transistor 702 is directly coupled to sense amplifier node 514. A gate of transistor 701 is coupled to reference voltage 318, and a gate of transistor 702 is coupled to reference voltage 317.

Read circuit 730 includes p-type transistor 703 and 704 commonly coupled in source-source series to receive VDDA voltage 716. A drain node of transistor 703 is directly coupled to sense amplifier node 513, and a drain node of transistor 704 is directly coupled to sense amplifier node 514. A gate of transistor 703 is coupled to top readbar signal 315, and a gate of transistor 704 is coupled to bottom readbar signal 316.

Bit voltage select circuit 740 includes n-type transistor 705 and 706 commonly coupled in drain-drain series to pull sense amplifier nodes 513 and 514 to VBIT voltage 515 during precharge state 404. A source node of transistor 705 is directly coupled to sense amplifier node 513, and a source node of transistor 706 is directly coupled to sense amplifier node 514. Gates of transistors 705 and 706 are coupled to precharge signal 714. Thus, bitlines 311 and 312 may be precharged to a standby voltage level, namely VBIT, when precharge signal 714 is asserted or active. Thus, it should be understood that bit voltage select circuit 740 in this embodiment is a precharge circuit.

Figure 8:
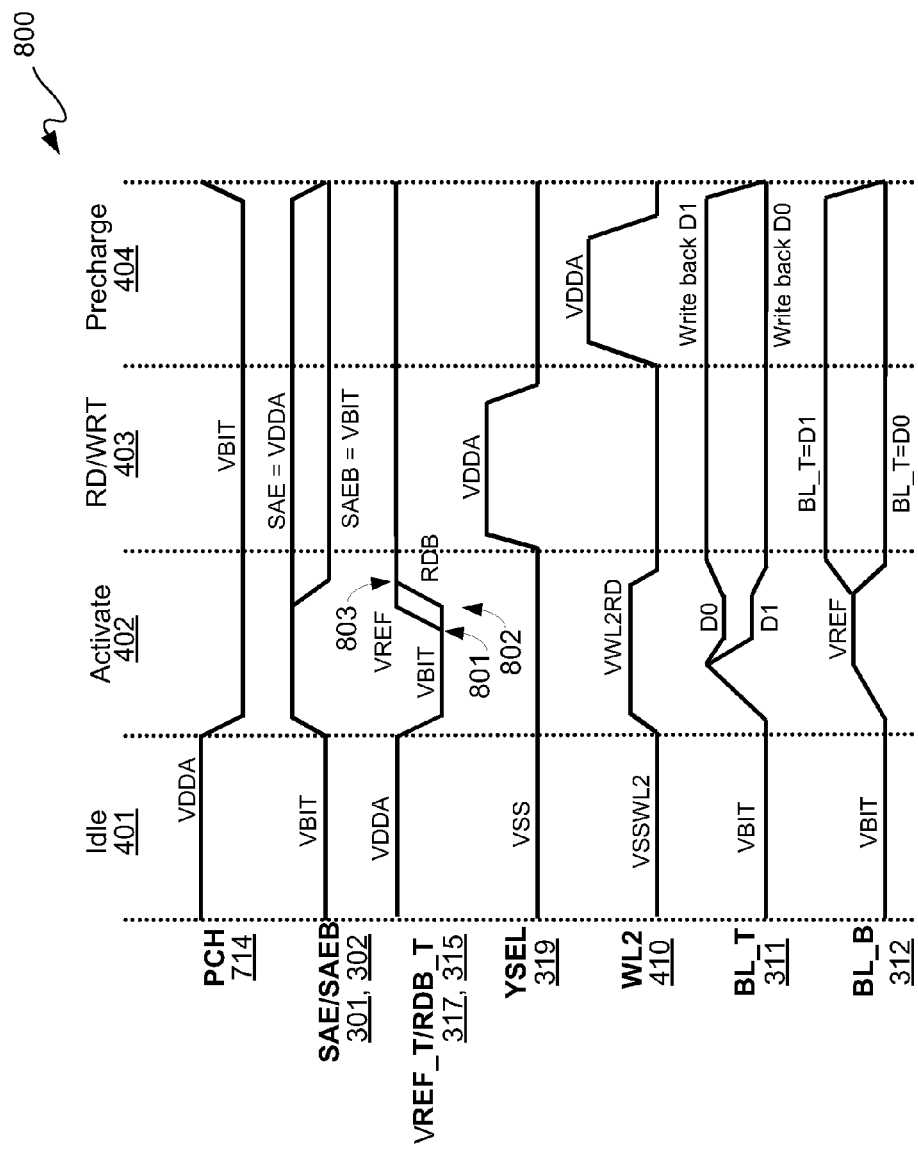

FIG. 8 is a signal diagram depicting an exemplary embodiment of DDR3 operations 800 for sense amplifier 700 of FIG. 7. As some of operations 800 are the same as operations 400 of FIG. 4, generally only differences are described for purposes of clarity, and thus generally only signals 315, 317, and 714 are thus described hereinbelow. Operations 800 are described with simultaneous reference to FIGS. 7 and 8.

During idle state 401, signals 315, 317, and 714 are all held at VDDA. Accordingly, transistors 705 and 706 are ON, and transistors 703 and 702 are OFF. Thus, bitlines 311 and 312 are precharged to their VBIT standby state voltage level.

Generally at the initiation of activate state 402, precharge signal 714 is transitioned to a VBIT voltage level. Precharge signal 714 is held at such VBIT voltage level through read/write state 403 and through most of precharge state 404. Toward the end of precharge state 404, precharge signal 714 is transitioned back to VDDA as an accessed row for example is closed.

Generally at the initiation of activate state 402, signals 315 and 317 are transitioned from VDDA to VBIT. Generally at time 801, VREF signal 317 begins to transition back to a VDDA voltage level, and shortly thereafter generally at time 802 readbar signal 315 begins to transition back to a VDDA voltage level. Such VDDA voltage level for signals 315 and 317 is maintained from time 803 toward the end of activate state 402 and through states 403 and 404.

Figure 9:
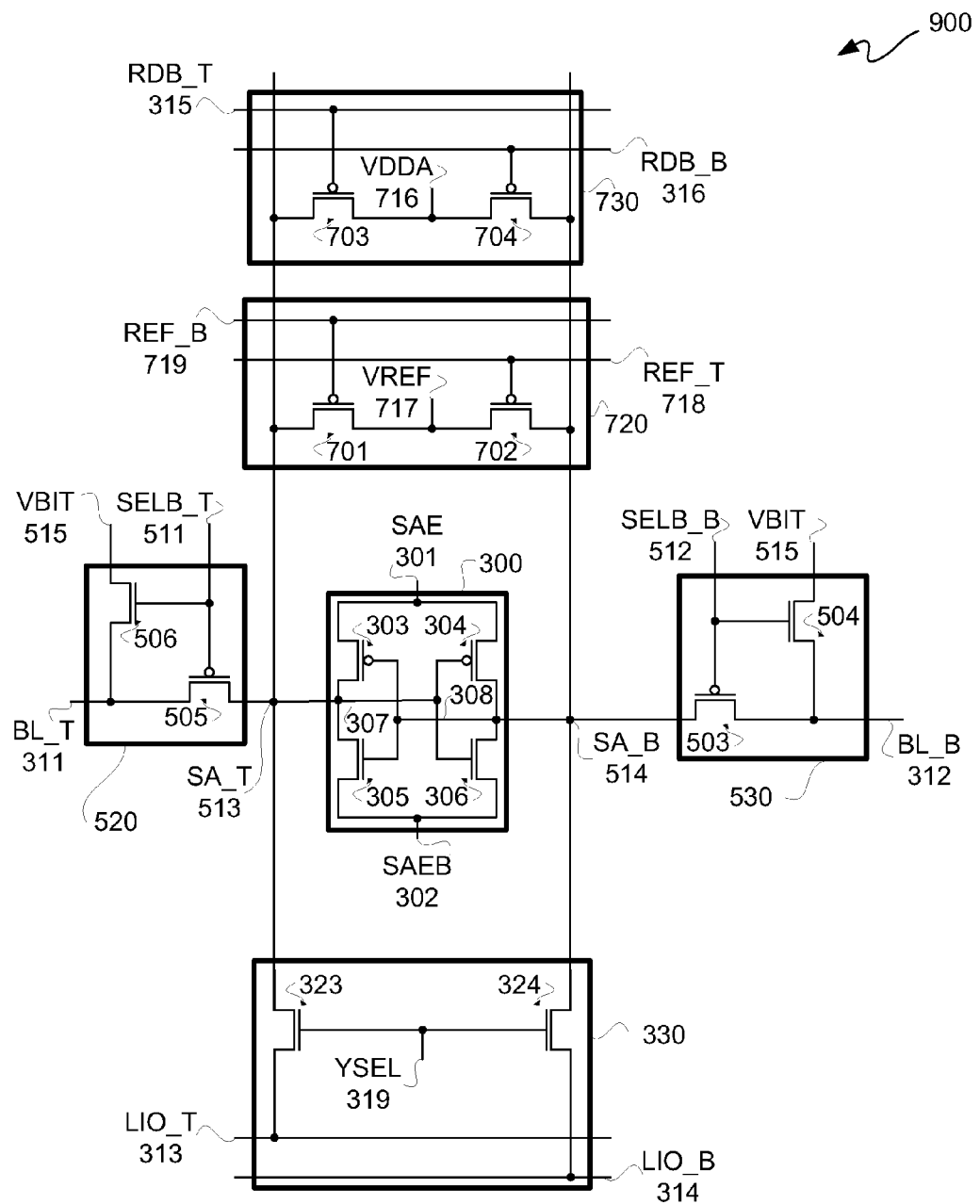

FIG. 9 is a circuit diagram depicting an exemplary embodiment of a sense amplifier 900. Sense amplifier 900 is sense amplifier 700 of FIG. 7 in that it includes latch circuit 300, select input/output circuit 330, read circuit 730, and reference voltage circuit 720, as previously described. Sense amplifier 900 does not include bit voltage select circuit 740. However, sense amplifier 900 includes bit voltage select circuits 520 and 530, as previously described with reference to FIG. 5.

Figure 10:
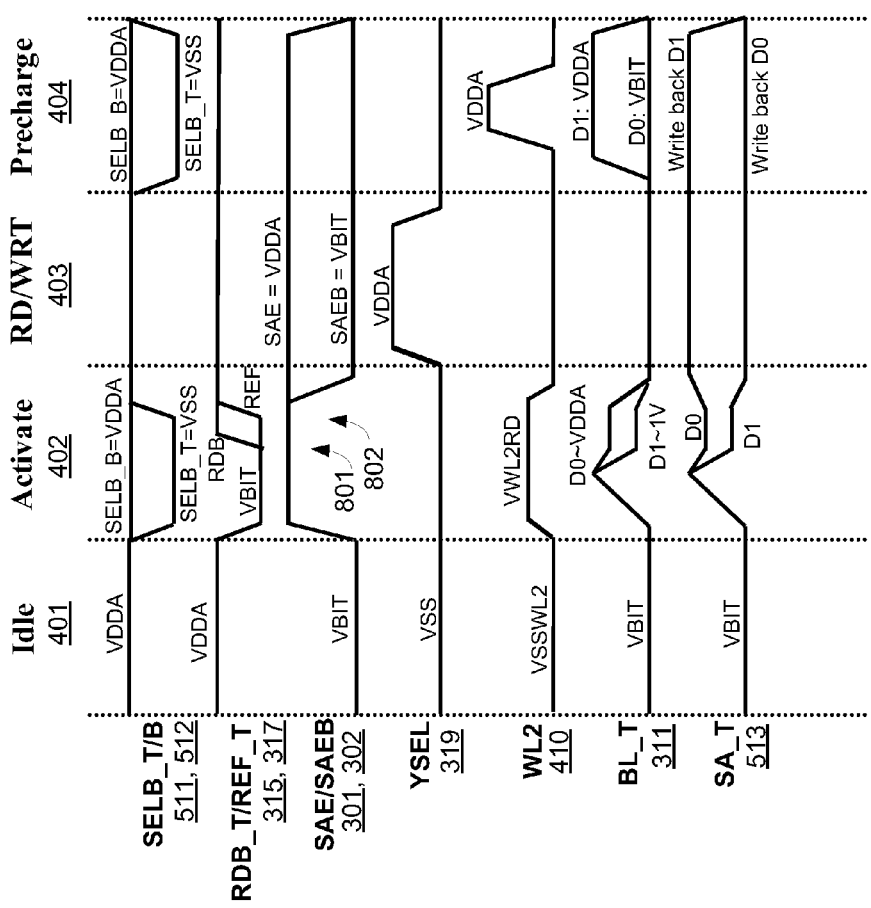

FIG. 10 is a signal diagram depicting an exemplary embodiment of DDR3 operations 1000 for sense amplifier 900 of FIG. 9. Operations 1000 of FIG. 10 are further described with simultaneous reference to FIGS. 9 and 10.

Signals 301, 302, 311, 319, 410, and 511-513 have been previously described with reference to FIG. 6A, and such description is generally not repeated for purposes of clarity.

During idle state 401, signals 315 and 317 are all held at VDDA. Accordingly, transistors 703 and 702 are OFF. During idle state 401, bitlines 311 and 312 are precharged to their VBIT standby state voltage level, as coupled to VBIT voltage 515 via circuits 520 and 530.

Generally at the initiation of activate state 402, signals 315 and 317 are transitioned from VDDA to VBIT. Generally at time 801, readbar signal 315 begins to transition back to a VDDA voltage level, and shortly thereafter generally at time 802 reference voltage signal 317 begins to transition back to a VDDA voltage level. Such VDDA voltage level for signals 315 and 317 is maintained from time 803 toward the end of activate state 402 and through states 403 and 404.

Figure 11:
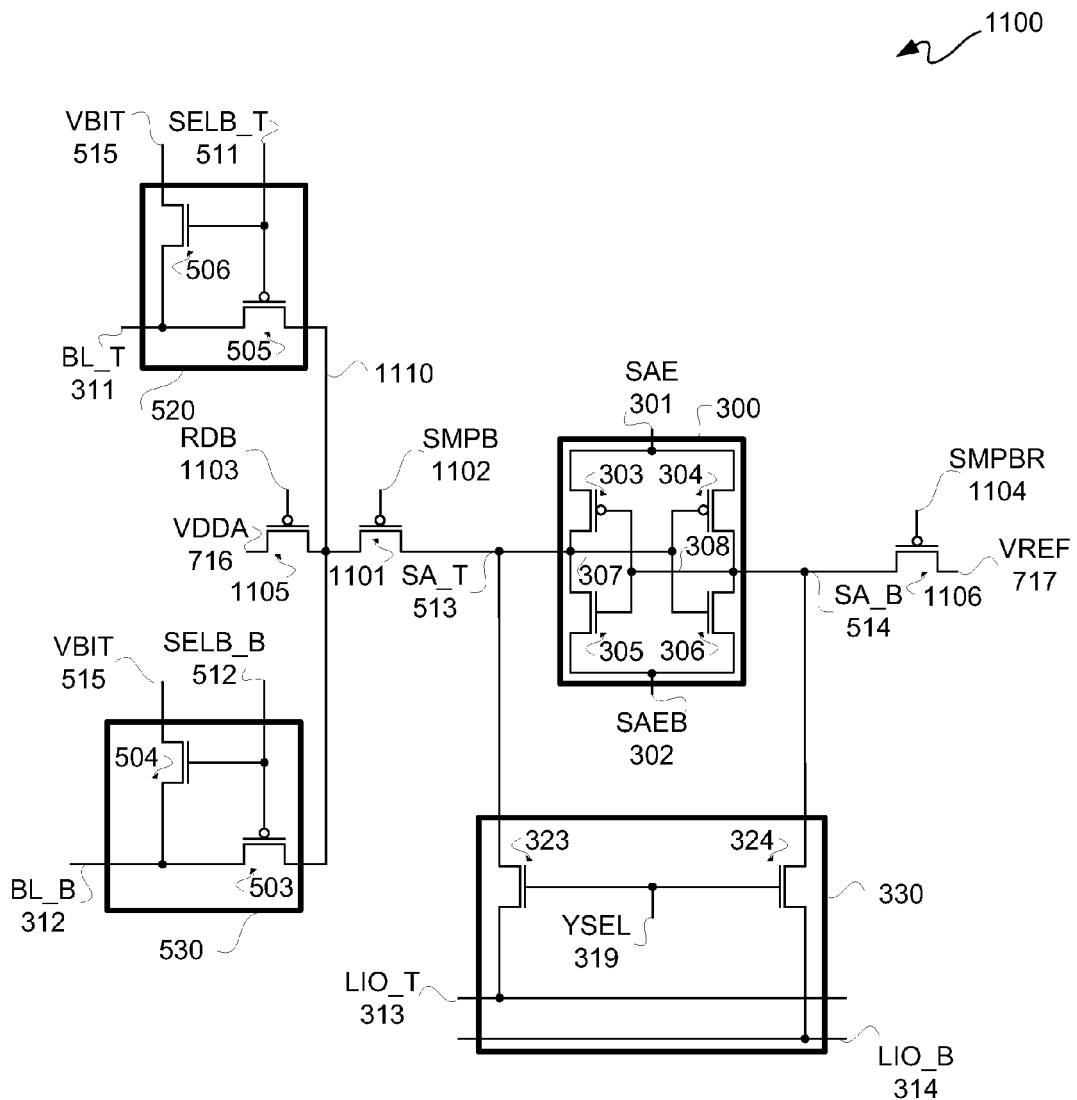

FIG. 11 is a circuit diagram depicting an exemplary embodiment of a sense amplifier 1100. Sense amplifier 1100 includes latch circuit 300 and select I/O circuit 330, as previously described with reference to FIG. 3. Sense amplifier further includes bit voltage select circuits 520 and 530, and p-type transistors 1101, 1105, and 1106.

A source/drain node of transistor 1101 is coupled to sense amplifier node 513, and a source/drain node of transistor 1106 is coupled to sense amplifier node 514. Another source/drain node of transistor 1101 is coupled to an intermediate node 1110, and another source/drain node of transistor 1106 is coupled to reference voltage 717. A gate of transistor 1101 is coupled to a sample bar ("SMPB") signal 1102. Sample bar signal 1102 in this exemplary embodiment is active low, and transistor 1101 is a sampling transistor to sample voltage at sense amplifier node 513. A gate of transistor 1106 is coupled to sample bar reference ("SMPBR") signal 1104, which is the same signal as sample bar signal 1102 except it is for a reference side of sense amplifier 1100.

A source/drain node of transistor 503 is coupled to intermediate node 1110, and a source/drain node of transistor 505 is coupled to intermediate node 1110. The other source/drain nodes of transistor 503 and 503 are coupled to bitlines 312 and 311 and transistors 504 and 506, as previously described herein.

A source/drain node of transistor 1105 is coupled to intermediate node 1110, and another source/drain node of transistor 1105 is coupled to VDDA supply voltage 716. A gate of transistor 1105 is coupled to readbar signal 1103. Readbar signal 1103 may be readbar signal 315.

Figure 12:
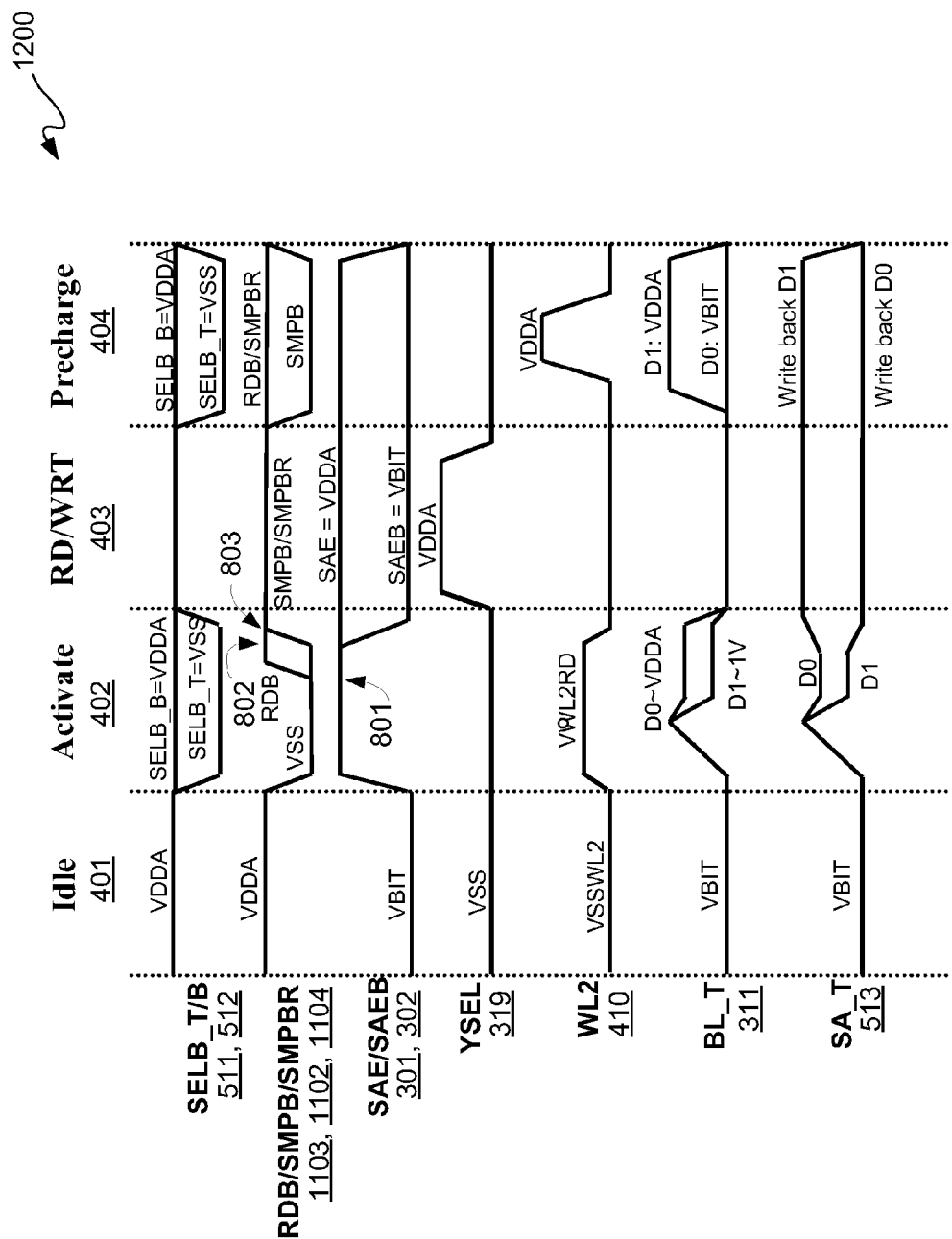

FIG. 12 is a signal diagram depicting an exemplary embodiment of DDR3 operations 1200 for sense amplifier 1100 of FIG. 11. Operations 1200 of FIG. 12 are further described with simultaneous reference to FIGS. 11 and 12.

All the signals of operations 1200 have been previously described herein with reference to FIG. 6A except for signals 1102 through 1104, and thus for purposes of clarity, generally only signals 1102 through 1104 are further described.

During idle state 401, signals 1102 through 1104 are held at VDDA. Generally at the initiation of activate state 402, signals 1102 through 1104 are transitioned from VDDA to Vss. Generally at time 801, readbar signal 1103 begins to transition back to a VDDA voltage level, and shortly thereafter generally at time 802 sample bar signals 1102 and 1104 begin to transition back to a VDDA voltage level. Such VDDA voltage level for signals 1102 through 1004 is maintained generally from time 803 toward the end of activate state 402 and through read/write state 403. During precharge state 404, signals 1103 and 1104 are held at VDDA, while sample bar signal 1102 is pulsed low, namely transitioned to Vss and then transitioned back up to VDDA generally at the close of a row access for example.

Figure 13:
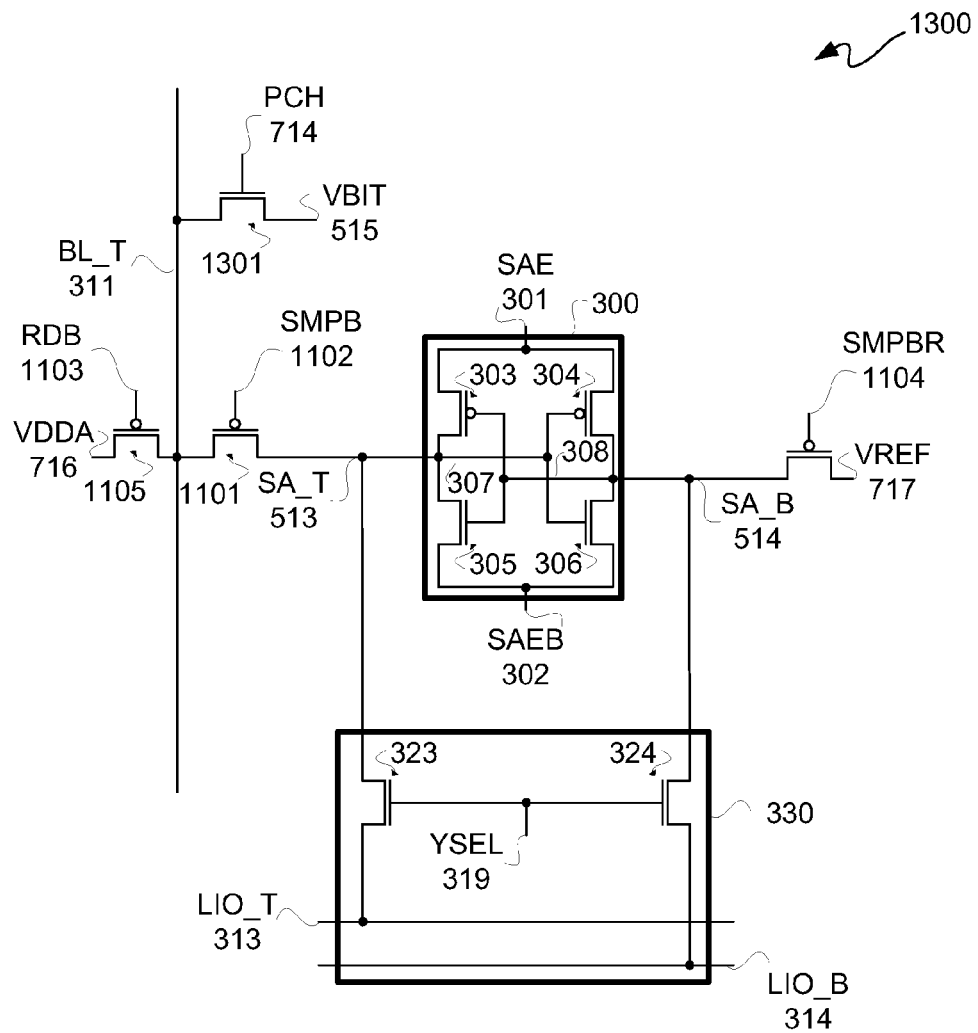

FIG. 13 is a circuit diagram depicting an exemplary embodiment of a sense amplifier 1300. Sense amplifier 1300 includes latch circuit 300 and select I/O circuit 330, as previously described with reference to FIG. 3. Sense amplifier further includes p-type transistors 1101, 1105, and 1106, as previously described with reference to FIG. 11, except rather than coupling source/drain nodes of transistor 1101 and 1105 to an intermediate node, such source/drain nodes of transistors 1101 and 1105 are coupled to bitline 311. Furthermore, an n-type transistor 1301 has a source/drain node coupled to bitline 311 and another source/drain node coupled to VBIT voltage 515. A gate of transistor 1301 is coupled to precharge signal 714.

Figure 14:
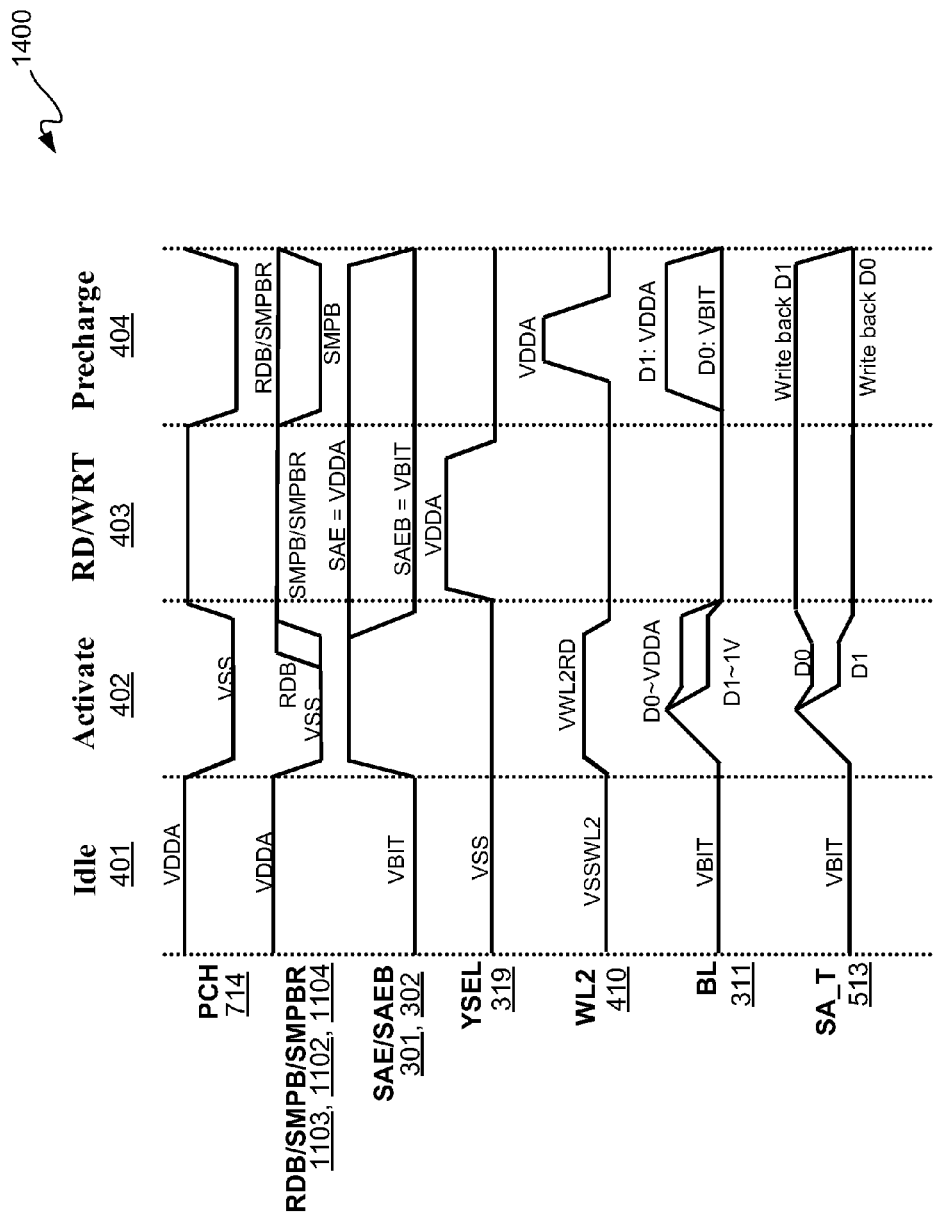

FIG. 14 is a signal diagram depicting an exemplary embodiment of DDR3 operations 1400 for sense amplifier 1300 of FIG. 13. Operations 1400 of FIG. 14 are further described with simultaneous reference to FIGS. 13 and 14.

All the signals of operations 1400 have been previously described herein with reference to FIGS. 6A and 12 except for precharge signal 714. Thus, for purposes of clarity, generally only precharge signal 714 for this exemplary embodiment is further described.

During idle state 401, precharge signal 714 is held at VDDA. During activate state 402, precharge signal 714 is pulsed low to Vss and transitions back to VDDA toward the end of activate state 402. Precharge signal 714 is held at VDDA during read/write state 403. Precharge signal 714 is pulse low to Vss generally at the initiation of precharge state 404 and then is transitioned back to VDDA generally toward the end of precharge state 404.

FIG. 15 is a circuit diagram depicting an exemplary embodiment of a sense amplifier 1500. Sense amplifier 1500 is the same as sense amplifier 1100 of FIG. 11, except with the additions of p-type transistors 1501 and 1502 to allow non-inverting read-modify-write or non-inverting refresh operation for example.

A source/drain node of p-type transistor 1502 is coupled to intermediate node 1110, and another source/drain node of transistor 1502 is coupled to sense amplifier node 514. Gates of transistors 1501 and 1502 are commonly coupled to receive write bar ("WRTB") signal 1511. A source/drain node of transistor 1501 is coupled to sense amplifier node 513, and another source/drain node of transistor 1501 is coupled to an electrically floating node 1512. The purpose of including transistor 1501 is to maintain the load balance between sense amplifier nodes 513 and 514.

Figure 16:
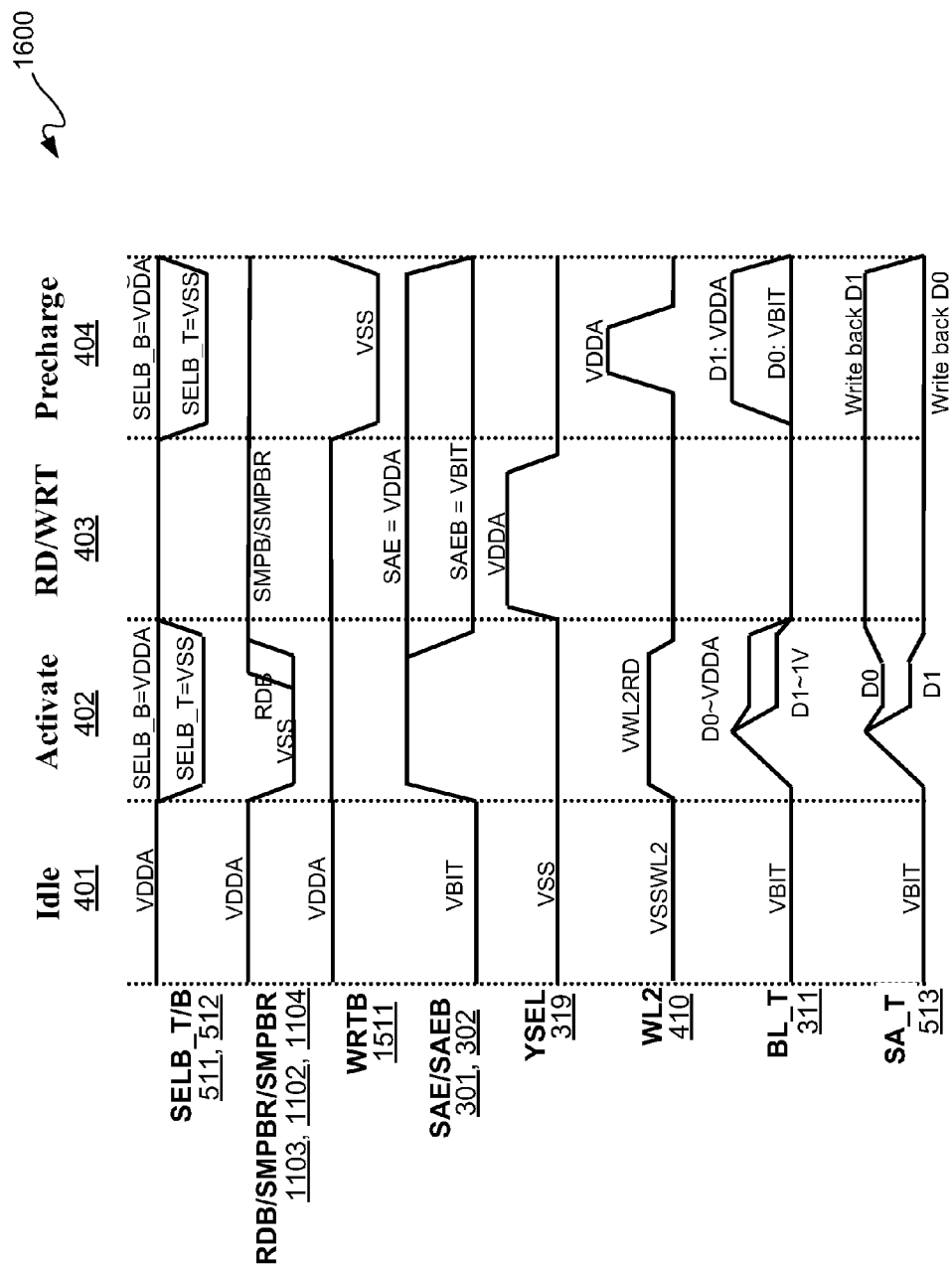

FIG. 16 is a signal diagram depicting an exemplary embodiment of DDR3 operations 1600 for sense amplifier 1500 of FIG. 15. Operations 1600 of FIG. 16 are further described with simultaneous reference to FIGS. 15 and 16.

All the signals of operations 1600 have been previously described herein with reference to FIGS. 6A and 14 except for write bar signal 1511. Thus, for purposes of clarity, generally only write bar signal 1511 is further described.

During states 401 through 403, write bar signal 1511 is held at VDDA. Write bar signal 1511 is pulse low to Vss generally at the initiation of precharge state 404 and then is transitioned back to VDDA generally toward the end of precharge state 404.

FIG. 17 is a flow diagram depicting an exemplary embodiment of operations 1700 for a sense amplifier for a refresh of a grouping of memory cells of an array. More particularly, operations 1700 may be for any sense amplifier of FIGS. 3, 5, 7, 9, 11, and 13 described herein for any of the embodiments of memory cells 110 of any of the embodiments of array 100.

At 1701, latch circuits, such as latch circuit 300, are activated, such as by asserting enable signals 301 and 302 during activate state 402, for sense amplifiers associated with a grouping, such as a column or row, of thyristor-based memory cells of a memory array. At 1702, data states of such grouping of thyristor-based memory cells are read, such as during read/write state 403.

At 1703, data states for such grouping of thyristor-based memory cells are written back without changing voltage level at sense nodes of the latch circuits as between the reading at 1702 and the writing back at 1703. Such write back at 1704 may be during precharge state 404. As previously described, such writing back without changing sense amplifier nodal voltages at sense nodes of latch circuits, such as voltages at sense amplifier nodes 513 and 514, cause an inversion. In other words, data states written back are the inverse of data states read for such grouping of thyristor-base memory cells. At 1704, such written back data states may be stored in thyristor-based memory cells of the grouping.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit, comprising:
a sense amplifier coupled to a first bitline and a second bitline of a memory array;
wherein the sense amplifier includes:
a latch circuit having a first sense amplifier node and a second sense amplifier node respectively coupled to the first bitline and the second bitline;
a group select input/output circuit coupled to the first sense amplifier node and the second sense amplifier node; and
a read-precharge-reference voltage circuit coupled to the first sense amplifier node and the second sense amplifier node;
wherein the read-precharge-reference circuit includes:
a first transistor coupled between a first reference voltage and the first sense amplifier node for pass gating, the first transistor gated with a first read signal; and
a second transistor coupled between a second reference voltage and the second sense amplifier node for pass gating, the second transistor gated with a second read signal;
a first bit voltage select circuit coupled between the first sense amplifier node and the first bitline;
a second bit voltage select circuit coupled between the second sense amplifier node and the second bitline;
wherein the first bit voltage select circuit includes a third transistor coupled between the first sense amplifier node and the first bitline for pass gating;
wherein the first bit voltage select circuit further includes a fourth transistor commonly gated with the third transistor to receive a first select signal, the fourth transistor having a first source/drain node coupled to receive a bit voltage and a second source/drain node coupled to the first bitline;
wherein the second bit voltage select circuit includes a fifth transistor coupled between the second sense amplifier node and the second bitline for pass gating; and
wherein the second bit voltage select circuit further includes a sixth transistor commonly gated with the fifth transistor to receive a second select signal, the sixth transistor having a first source/drain node coupled to receive the bit voltage and a second source/drain node coupled to the second bitline.

2. The integrated circuit according to claim 1, wherein:
the sense amplifier is configured to read data in a first state and write back the data in a second state; and
the second state is an opposite data state with respect to the first state but equivalent or approximate to voltage levels on the first sense amplifier node and the second amplifier node of the first state.

3. The integrated circuit according to claim 1, wherein:
the memory array has a first wordline and a second wordline;
the first wordline is common to at least a subarray of the memory array;
the second wordline is common to either a single row or a single column of the memory array;
the memory array includes thyristor-based memory cells;
each thyristor-based memory cell of the memory array has a gate, a gate dielectric, a first base, a second base, a first emitter node, and a second emitter node;
the first emitter node, the first base, the second base, and the second emitter node in combination provide one of an NPNP or a PNPN structure for each of the thyristor-based memory cells;
the gate is separated from the first base by the gate dielectric for each of the thyristor-based memory cells and positioned for capacitively coupling to the first base during the first state and the second state;

the second wordline is commonly coupled to the gate of each of the thyristor-based memory cells of either the single row or the single column; and the first wordline is commonly coupled at either the first emitter node or the second emitter node of each of the thyristor-based memory cells of the memory array.

4. The integrated circuit according to claim 3, wherein:
the thyristor-based memory cells are dynamic random access memory cells; and
the thyristor-based memory cells are either vertical cells or lateral cells.

5. An integrated circuit, comprising:
a sense amplifier coupled to a first bitline and a second bitline of the memory array;
the sense amplifier including:
    a latch circuit having a first sense amplifier node and a second sense amplifier node respectively coupled to the first bitline and the second bitline;
    a group select input/output circuit coupled to the first sense amplifier node and the second sense amplifier node; and
    a reference voltage circuit, a read circuit, and a precharge circuit coupled in parallel with one another to the first sense amplifier node and the second sense amplifier node.

6. The integrated circuit according to claim 5, wherein the reference voltage circuit includes:
a first transistor and a second transistor each having a first source/drain node commonly coupled to receive a first reference voltage;
the first transistor coupled to the first sense amplifier node at a second source/drain node thereof;
the second transistor coupled to the second sense amplifier node a second source/drain node thereof;
the first transistor gated with a second reference voltage; and
the second transistor gated with a third reference voltage.

7. The integrated circuit according to claim 5, wherein the read circuit includes:
a first transistor and a second transistor each having a first source/drain node commonly coupled to receive a supply voltage;
the first transistor coupled to the first sense amplifier node at a second source/drain node thereof;
the second transistor coupled to the second sense amplifier node a second source/drain node thereof;
the first transistor gated with a first read signal; and
the second transistor gated with a second read signal.

8. The integrated circuit according to claim 5, wherein the precharge circuit includes:
a first transistor and a second transistor each having a first source/drain node commonly coupled to receive a bit voltage;
the first transistor coupled to the first sense amplifier node at a second source/drain node thereof;
the second transistor coupled to the second sense amplifier node a second source/drain node thereof; and
the first transistor and the second transistor each gated with a precharge signal.

9. The integrated circuit according to claim 5, wherein:
the sense amplifier is configured to read data in a first state and write back the data in a second state; and
the second state is an opposite data state with respect to the first state but equivalent or approximate to voltage levels on the first sense amplifier node and the second amplifier node of the first state.

10. The integrated circuit according to claim 9, wherein:
the memory array has a first wordline and a second wordline;
the first wordline is common to at least a subarray of the memory array;
the second wordline is common to either a single row or a single column of the memory array;
the memory array includes thyristor-based memory cells;
each thyristor-based memory cell of the memory array has a gate, a gate dielectric, a first base, a second base, a first emitter node, and a second emitter node;
the first emitter node, the first base, the second base, and the second emitter node in combination provide one of an NPNP or a PNPN structure for each of the thyristor-based memory cells;
the gate is separated from the first base by the gate dielectric for each of the thyristor-based memory cells and positioned for capacitively coupling to the first base during the first state and the second state;
the second wordline is commonly coupled to the gate of each of the thyristor-based memory cells of either the single row or the single column; and
the first wordline is commonly coupled at either the first emitter node or the second emitter node of each of the thyristor-based memory cells of the memory array.

11. The integrated circuit according to claim 10, wherein:
the thyristor-based memory cells are dynamic random access memory cells; and
the thyristor-based memory cells are either vertical cells or lateral cells.

12. An integrated circuit, comprising:
a sense amplifier coupled to a first bitline and a second bitline of the memory array;
the sense amplifier including:
    a latch circuit having a first sense amplifier node and a second sense amplifier node respectively coupled to the first bitline and the second bitline;
    a group select input/output circuit coupled to the first sense amplifier node and the second sense amplifier node; and
    a reference voltage circuit and a read circuit coupled in parallel with one another to the first sense amplifier node and the second sense amplifier node.

13. The integrated circuit according to claim 12, wherein the reference voltage circuit includes:
a first transistor and a second transistor each having a first source/drain node commonly coupled to receive a first reference voltage;
the first transistor coupled to the first sense amplifier node at a second source/drain node thereof;
the second transistor coupled to the second sense amplifier node a second source/drain node thereof;
the first transistor gated with a second reference voltage; and
the second transistor gated with a third reference voltage.

14. The integrated circuit according to claim 12, wherein the read circuit includes:
a first transistor and a second transistor each having a first source/drain node commonly coupled to receive a supply voltage;
the first transistor coupled to the first sense amplifier node at a second source/drain node thereof;
the second transistor coupled to the second sense amplifier node a second source/drain node thereof;
the first transistor gated with a first read signal; and
the second transistor gated with a second read signal.

15. The integrated circuit according to claim 14, further comprising:
- a first bit voltage select circuit coupled between the first sense amplifier node and the first bitline; and
- a second bit voltage select circuit coupled between the second sense amplifier node and the second bitline.

16. The integrated circuit according to claim 15, wherein:
- the first bit voltage select circuit includes a third transistor coupled between the first sense amplifier node and the first bitline for pass gating;
- the first bit voltage select circuit further includes a fourth transistor commonly gated with the third transistor to receive a first select signal, the fourth transistor having a first source/drain node coupled to receive a bit voltage and a second source/drain node coupled to the first bitline;
- the second bit voltage select circuit includes a fifth transistor coupled between the second sense amplifier node and the second bitline for pass gating; and
- the second bit voltage select circuit further includes a sixth transistor commonly gated with the fifth transistor to receive a second select signal, the sixth transistor having a first source/drain node coupled to receive the bit voltage and a second source/drain node coupled to the second bitline.

17. The integrated circuit according to claim 12, wherein:
- the sense amplifier is configured to read data in a first state and write back the data in a second state; and
- the second state is an opposite data state with respect to the first state but equivalent or approximate to voltage levels on the first sense amplifier node and the second amplifier node of the first state.

18. The integrated circuit according to claim 17, wherein:
- the memory array has a first wordline and a second wordline;
- the first wordline is common to at least a subarray of the memory array;
- the second wordline is common to either a single row or a single column of the memory array;
- the memory array includes thyristor-based memory cells;
- each thyristor-based memory cell of the memory array has a gate, a gate dielectric, a first base, a second base, a first emitter node, and a second emitter node;
- the first emitter node, the first base, the second base, and the second emitter node in combination provide one of an NPNP or a PNPN structure for each of the thyristor-based memory cells;
- the gate is separated from the first base by the gate dielectric for each of the thyristor-based memory cells and positioned for capacitively coupling to the first base during the first state and the second state;
- the second wordline is commonly coupled to the gate of each of the thyristor-based memory cells of either the single row or the single column; and
- the first wordline is commonly coupled at either the first emitter node or the second emitter node of each of the thyristor-based memory cells of the memory array.

19. The integrated circuit according to claim 18, wherein:
- the thyristor-based memory cells are dynamic random access memory cells; and
- the thyristor-based memory cells are vertical cells or lateral cells.

20. An integrated circuit, comprising:
- a sense amplifier coupled to a first bitline and a second bitline of the memory array;
- the sense amplifier including:
  - a latch circuit having a first sense amplifier node and a second sense amplifier node respectively coupled to the first bitline and the second bitline;
  - a group select input/output circuit coupled to the first sense amplifier node and the second sense amplifier node; and
  - a first transistor having a first source/drain node coupled to the first sense amplifier node and having a second source/drain node coupled to an intermediate node, the first transistor gated with a first sample signal;
  - a second transistor having a first source/drain node coupled to the second sense amplifier node and having a second source/drain node coupled to a reference voltage, the second transistor gated with a second sample signal;
  - a third transistor having a first source/drain node coupled to the intermediate node and having a second source drain node coupled to a supply voltage, the third transistor gated with a read signal;
  - a first bit voltage select circuit coupled between the intermediate node and the first bitline; and
  - a second bit voltage select circuit coupled between the intermediate node and the second bitline.

21. The integrated circuit according to claim 20, wherein:
- the first bit voltage select circuit includes a fourth transistor coupled between the first sense amplifier node and the first bitline;
- the first bit voltage select circuit further includes a fifth transistor commonly gated with the third transistor to receive a first select signal, the fifth transistor having a first source/drain node coupled to receive a bit voltage and a second source/drain node coupled to the first bitline;
- the second bit voltage select circuit includes a sixth transistor coupled between the second sense amplifier node and the second bitline; and
- the second bit voltage select circuit further includes a seventh transistor commonly gated with the sixth transistor to receive a second select signal, the seventh transistor having a first source/drain node coupled to receive the bit voltage and a second source/drain node coupled to the second bitline.

22. The integrated circuit according to claim 20, further comprising:
- a fourth transistor having a first source/drain node coupled to the intermediate node and having a second source/drain node coupled to the second sense amplifier node;
- a fifth transistor having a first source/drain node coupled to the first sense amplifier node and having a second source/drain node coupled to an electrically floating node; and
- the fourth transistor and the fifth transistor commonly gated with a write signal.

23. The integrated circuit according to claim 20, wherein:
- the sense amplifier is configured to read data in a first state and write back the data in a second state; and
- the second state is an opposite data state with respect to the first state but equivalent or approximate to voltage levels on the first sense amplifier node and the second amplifier node of the first state.

24. The integrated circuit according to claim 23, wherein:
- the memory array has a first wordline and a second wordline;
- the first wordline is common to at least a subarray of the memory array; and the second wordline is common to either a single row or a single column of the memory array;

the memory array includes thyristor-based memory cells;

each thyristor-based memory cell of the memory array has a gate, a gate dielectric, a first base, a second base, a first emitter node, and a second emitter node;

the first emitter node, the first base, the second base, and the second emitter node in combination provide one of an NPNP or a PNPN structure for each of the thyristor-based memory cells;

the gate is separated from the first base by the gate dielectric for each of the thyristor-based memory cells and positioned for capacitively coupling to the first base during the first state and the second state;

the second wordline is commonly coupled to the gate of each of the thyristor-based memory cells of either the single row or the single column; and the first wordline is commonly coupled at either the first emitter node or the second emitter node of each of the thyristor-based memory cells of the memory array.

25. The integrated circuit according to claim 24, wherein:

the thyristor-based memory cells are dynamic random access memory cells; and the thyristor-based memory cells are either vertical cells or lateral cells.

26. An integrated circuit, comprising:

a sense amplifier coupled to a first bitline and a second bitline of the memory array;

the sense amplifier including:
   a latch circuit having a first sense amplifier node and a second sense amplifier node respectively coupled to the first bitline and the second bitline;
   a group select input/output circuit coupled to the first sense amplifier node and the second sense amplifier node;
   a first transistor having a first source/drain node coupled to the first sense amplifier node and having a second source/drain node coupled to a bitline, the first transistor gated with a first sample signal;
   a second transistor having a first source/drain node coupled to the second sense amplifier node and having a second source/drain node coupled to a reference voltage, the second transistor gated with a second sample signal;
   a third transistor having a first source/drain node coupled to the bitline and having a second source drain node coupled to a supply voltage, the third transistor gated with a read signal; and
   a fourth transistor having a first source/drain node coupled to the bitline and having a second source/drain node coupled to a bit voltage, the fourth transistor gated with a precharge signal.

27. The integrated circuit according to claim 26, wherein:

the sense amplifier is configured to read data in a first state and write back the data in a second state; and the second state is an opposite data state with respect to the first state but equivalent or approximate to voltage levels on the first sense amplifier node and the second amplifier node of the first state.

28. The integrated circuit according to claim 27, wherein:

the memory array has a first wordline and a second wordline;

the first wordline is common to at least a subarray of the memory array; and the second wordline is common to either a single row or a single column of the memory array;

the memory array includes thyristor-based memory cells;

each thyristor-based memory cell of the memory array has a gate, a gate dielectric, a first base, a second base, a first emitter node, and a second emitter node;

the first emitter node, the first base, the second base, and the second emitter node in combination provide one of an NPNP or a PNPN structure for each of the thyristor-based memory cells;

the gate is separated from the first base by the gate dielectric for each of the thyristor-based memory cells and positioned for capacitively coupling to the first base during the first state and the second state;

the second wordline is commonly coupled to the gate of each of the thyristor-based memory cells of either the single row or the single column; and the first wordline is commonly coupled at either the first emitter node or the second emitter node of each of the thyristor-based memory cells of the memory array.

29. The integrated circuit according to claim 28, wherein:

the thyristor-based memory cells are dynamic random access memory cells; and the thyristor-based memory cells are either vertical cells or lateral cells.

* * * * *